United States Patent
Yamazaki

(10) Patent No.: US 8,237,167 B2
(45) Date of Patent: Aug. 7, 2012

(54) SEMICONDUCTOR DEVICE AND MANUFACTURING METHOD THEREOF

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/357,958

(22) Filed: Jan. 25, 2012

(65) Prior Publication Data

US 2012/0119214 A1    May 17, 2012

Related U.S. Application Data

(63) Continuation of application No. 12/634,048, filed on Dec. 9, 2009, now Pat. No. 8,114,720.

(30) Foreign Application Priority Data

Dec. 25, 2008 (JP) .................................. 2008-330258

(51) Int. Cl.
*H01L 29/04* (2006.01)
*H01L 31/0376* (2006.01)
*H01L 31/20* (2006.01)
*H01L 31/036* (2006.01)

(52) U.S. Cl. .................. 257/59; 257/768; 257/E21.412; 438/34; 438/149; 438/703

(58) Field of Classification Search .................. None
See application file for complete search history.

(56) References Cited

U.S. PATENT DOCUMENTS

| | | | |
|---|---|---|---|
| 5,155,564 | A | 10/1992 | Hishida et al. |
| 5,383,041 | A | 1/1995 | Yamazaki et al. |
| 5,500,538 | A | 3/1996 | Yamazaki et al. |
| 5,731,856 | A | 3/1998 | Kim et al. |
| 5,744,864 | A | 4/1998 | Cillessen et al. |
| 5,847,410 | A | 12/1998 | Nakajima |
| 6,294,274 | B1 | 9/2001 | Kawazoe et al. |
| 6,563,174 | B2 | 5/2003 | Kawasaki et al. |
| 6,586,346 | B1 | 7/2003 | Yamazaki et al. |

(Continued)

FOREIGN PATENT DOCUMENTS

EP   0 349 255   1/1990

(Continued)

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

(Continued)

*Primary Examiner* — Zandra Smith
*Assistant Examiner* — Khanh Duong
(74) *Attorney, Agent, or Firm* — Eric J. Robinson; Robinson Intellectual Property Law Office, P.C.

(57) ABSTRACT

An object is to reduce a capacitance value of parasitic capacitance without decreasing driving capability of a transistor in a semiconductor device such as an active matrix display device. Further, another object is to provide a semiconductor device in which the capacitance value of the parasitic capacitance was reduced, at low cost. An insulating layer other than a gate insulating layer is provided between a wiring which is formed of the same material layer as a gate electrode of the transistor and a wiring which is formed of the same material layer as a source electrode or a drain electrode.

13 Claims, 25 Drawing Sheets

U.S. PATENT DOCUMENTS

| | | |
|---|---|---|
| 6,727,522 B1 | 4/2004 | Kawasaki et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,795,796 B2 | 9/2010 | Kamakura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0157855 A1 | 7/2006 | Kamakura |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |

FOREIGN PATENT DOCUMENTS

| | | |
|---|---|---|
| EP | 1 737 044 A | 12/2006 |
| EP | 2 226 847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-013928 | 1/1990 |
| JP | 03-231472 A | 10/1991 |
| JP | 04-214536 | 8/1992 |
| JP | 4-220627 | 8/1992 |
| JP | 05-061069 | 3/1993 |
| JP | 05-251705 A | 9/1993 |
| JP | 07-110493 | 4/1995 |
| JP | 08-029805 | 2/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-193248 | 7/2004 |
| JP | 2004-273614 A | 9/2004 |
| JP | 2004-273732 A | 9/2004 |
| JP | 2006-201217 | 8/2006 |
| JP | 2006-215086 | 8/2006 |
| JP | 2007-096055 A | 4/2007 |
| JP | 2007-123861 A | 5/2007 |
| JP | 2007-250983 A | 9/2007 |
| WO | WO 2004/114391 | 12/2004 |
| WO | WO 2007/119386 | 10/2007 |

OTHER PUBLICATIONS

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the In₂O₃-Ga₂ZnO₄-ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, In₂O₃(ZnO)$m$ ($m$=3, 4, and 5), InGaO₃(ZnO)₃, and Ga₂O₃(ZnO)$m$ ($m$=7, 8, 9, and 16) in the In₂O₃-ZnGa₂O₄-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Li et al., "Modulated Structures of Homologous Compounds In$MO_3$(ZnO)$_m$ (M=In,Ga; m=Integer) Described by Four-Dimensional Superspace Group," Journal of Solid State Chemistry, 1998, vol. 139, pp. 347-355.

Lee et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing MoO₃ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Jeong et al., "3.1: Distinguished Paper: 12.1-Inch WXGA Amoled Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUS on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA Amoled Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: AL and SN-Doped Zinc Indium Oxide Thin Film Transistors for Amoled Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission Amoled Display on Plastic Film and Its Bending Properties," SID Digest '09: SID International Symposium Digest of Technical Papers, May 31, 2009, pp. 983-985.

Sakata et al., "Development of 4.0-In. Amoled Display With Driver Circuit Using Amorphous In-Ga-Zn-Oxide TFTS," IDW '09: Proceedings of the 16$^{th}$ International Display Workshops, 2009, pp. 689-692.

Park et al., "Amorphous Indium-Gallium-Zinc Oxide TFTS and Their Application for Large Size Amoled," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel Using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 IN. QVGA Amoled Display Using In-Ga-Zn-Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined with Ultra Low-Power Driving Technology," SID Digest '09: SID International Symposium Digest of Technical Papers, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 2, 2002, vol. 1, pp. 64-68.

Kimizuka et al., "Spinel, YbFe2O4, and Yb2Fe3O7 Types of Structures for Compounds in the In2O3 and Sc2O3-A2O3-BO Systems [A: Fe, Ga, Or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Fortunato et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA Amoled Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Nakamura, "Synthesis of Homologous Compound with New Long-Period Structure," NIRIM Newsletter, Mar. 1, 1995, vol. 150, pp. 1-4.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review. B), Jan. 15, 2000, vol. 61, No. 3, pp. 1811-1816.

Nomura et al., "Amorphous Oxide Semiconductors for High-Performance Flexible Thin-Film Transistors," JPN. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), 2007, vol. 76, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review. B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size Amoled Displays," IDW '08: Proceedings of the $6^{th}$ International Display Workshops, Dec. 3, 2008, pp. 581-584.

Kim et al., "High-Performance oxide thin film transistors passivated by various gas plasmas," $214^{th}$ ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

114

116

118   120   122

124

160   162

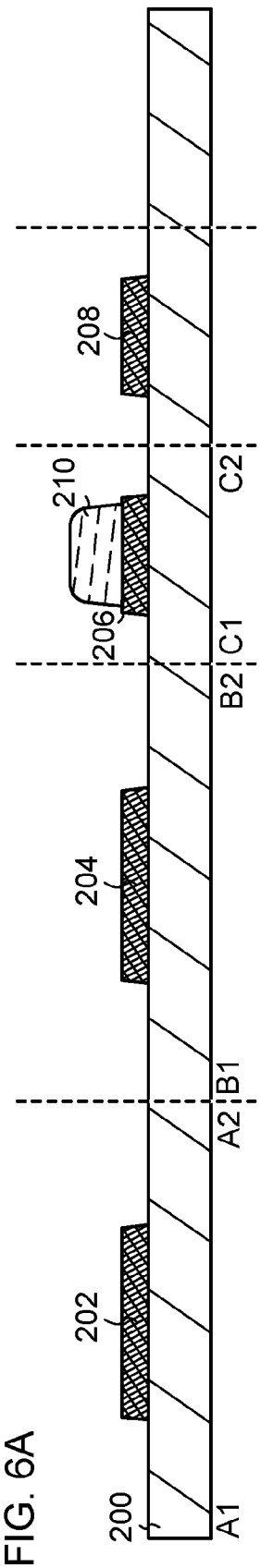
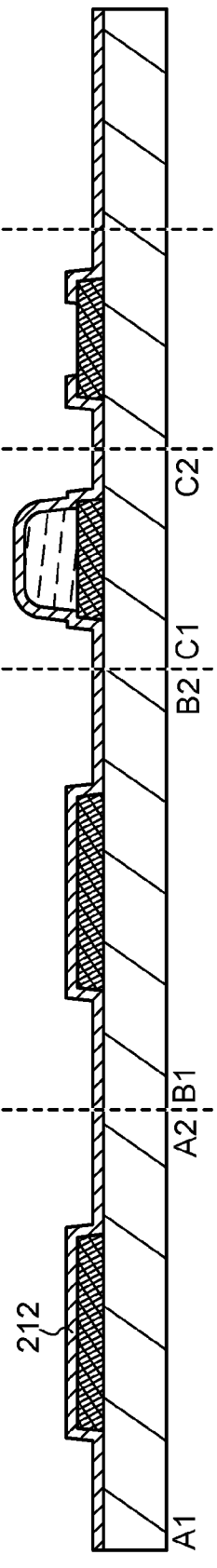
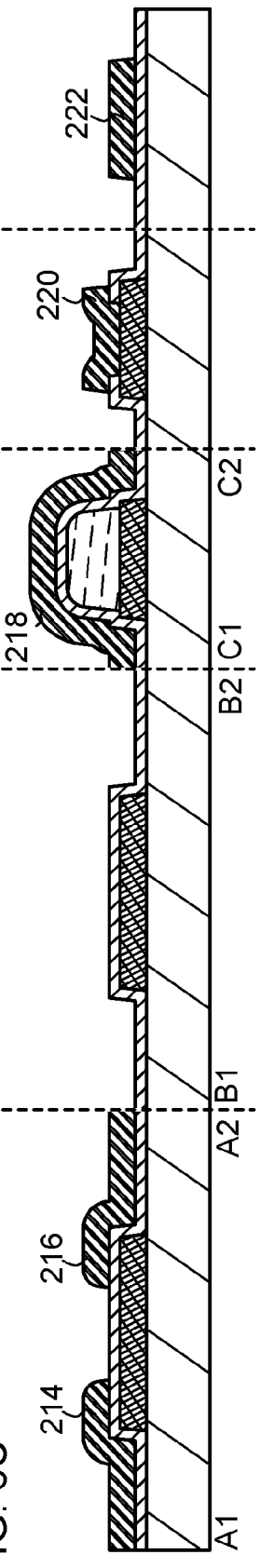
FIG. 6A
FIG. 6B
FIG. 6C

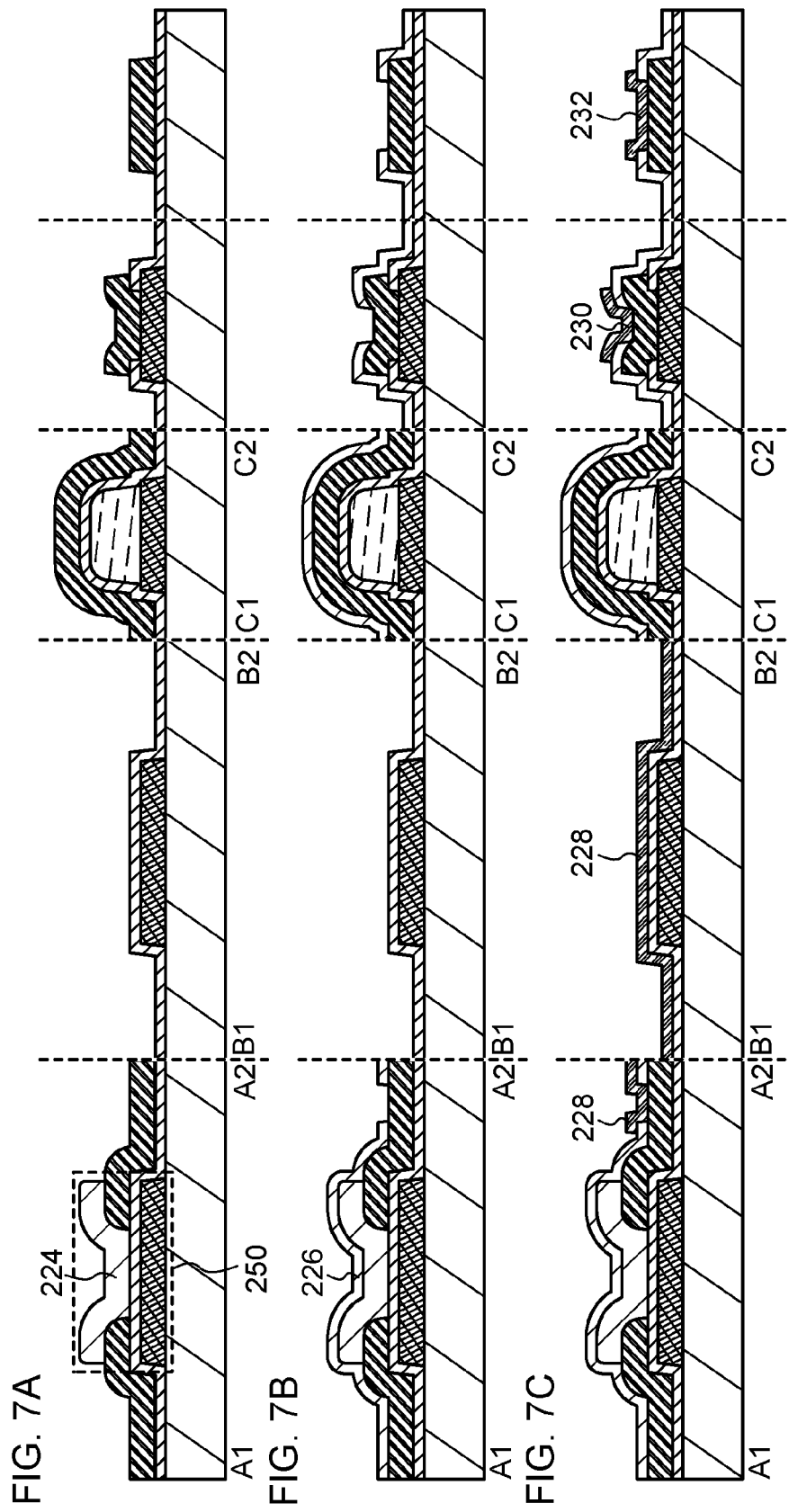

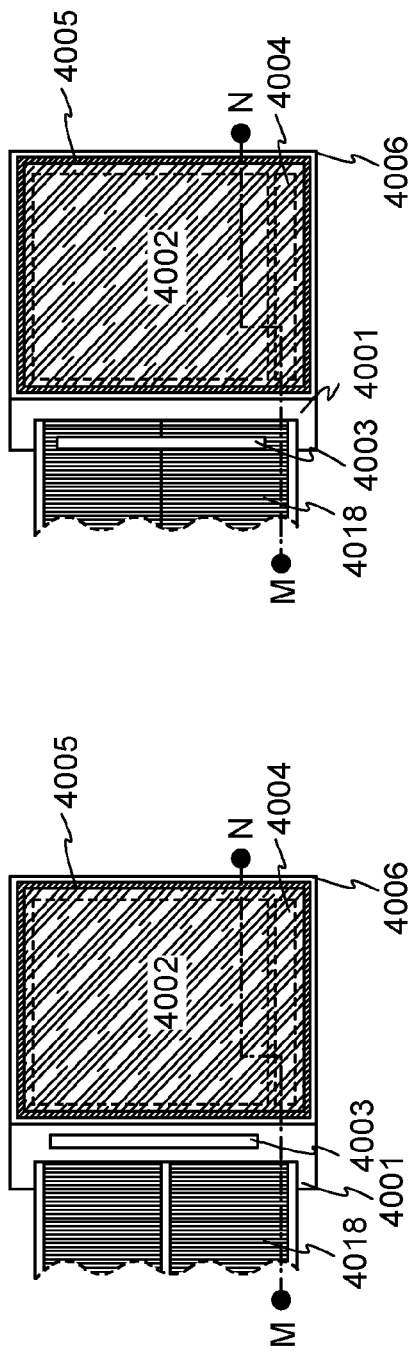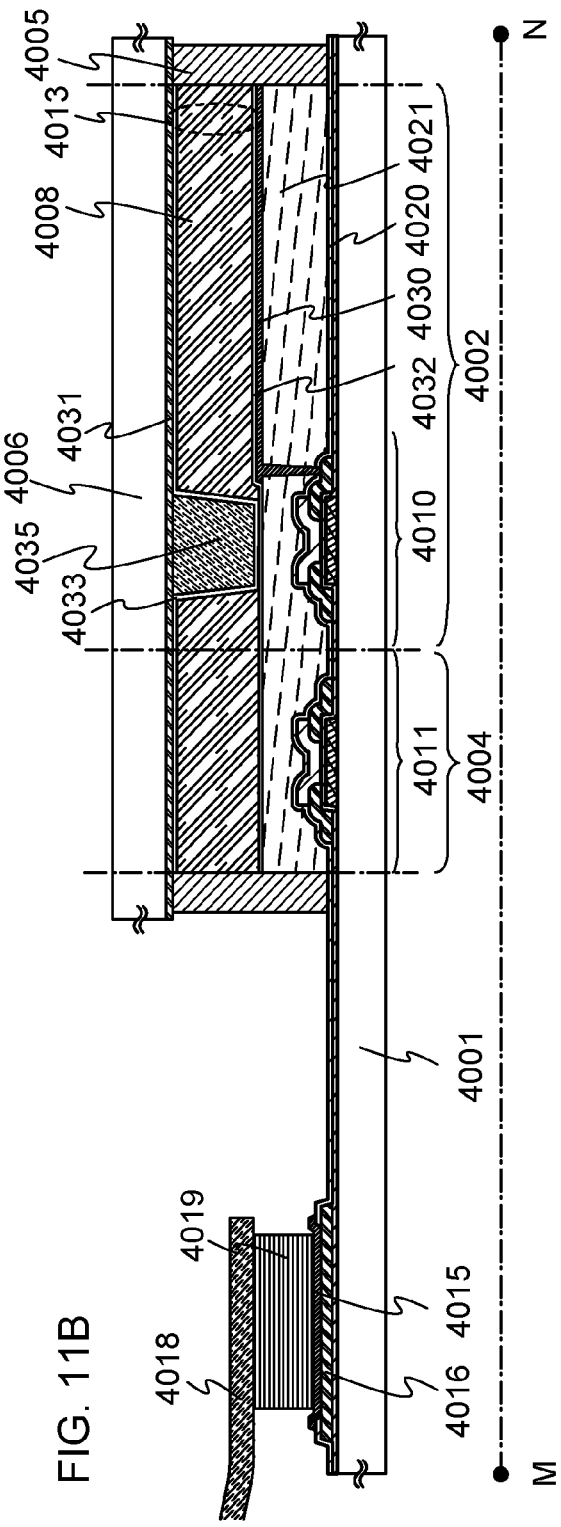

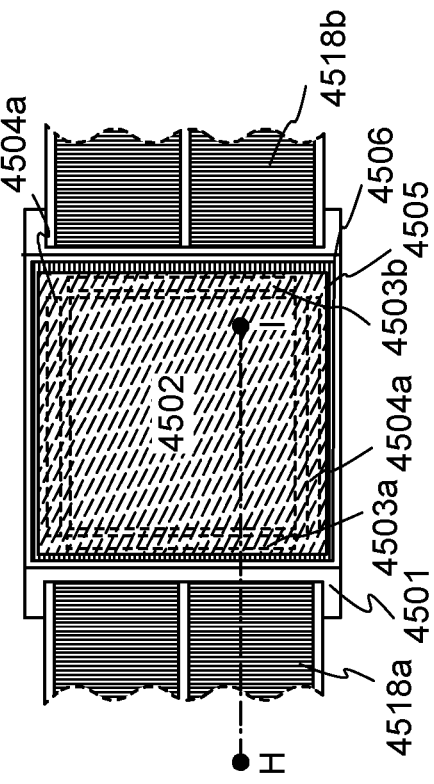
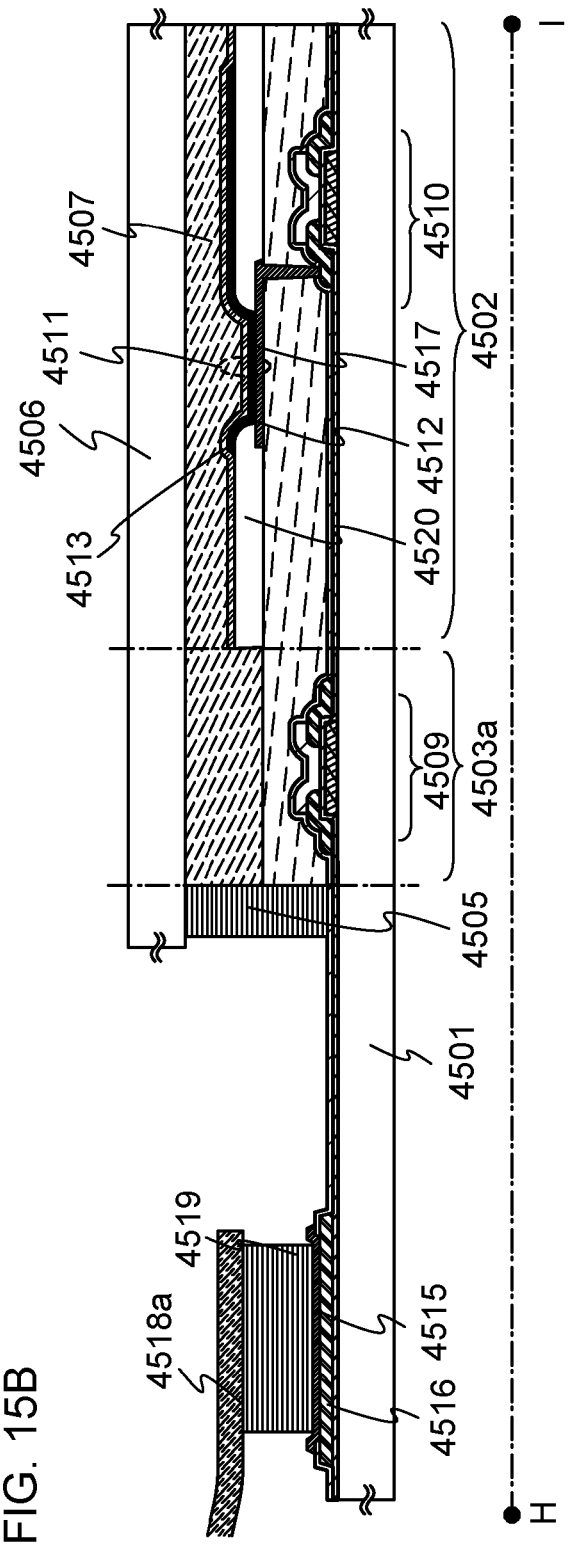
FIG. 15A
FIG. 15B

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

A so-called flat panel display (FPD) typified by a liquid crystal display device has characteristics of being thin and low power consumption. Therefore, flat panel displays are widely used in various fields. Among them, since an active matrix liquid crystal display device having a thin film transistor (TFT) in each pixel has high display performance, the market size is remarkably being expanded.

A plurality of scanning lines and signal lines is formed over an active matrix substrate used for an active matrix display device and these wirings intersect with each other with an insulating layer interposed therebetween. Thin film transistors are provided close to an intersection portion of the scanning line and the signal line and each pixel is switched (e.g., see Patent Document 1).

REFERENCE

Patent Document

[Patent Document 1] Japanese Published Patent Application No. H04-220627

Here, electrostatic capacitance (also called "parasitic capacitance") is formed in the intersection portion of the scanning line and the signal line because of its structure. Since parasitic capacitance causes signal delay or the like and makes display quality decreased, a capacitance value thereof is preferably small.

As a method for reducing parasitic capacitance which is generated in the intersection portion of the scanning line and the signal line, for example, a method for forming an insulating film thick which covers the scanning line is given; however, in a bottom-gate transistor, a gate insulating layer is formed between the scanning line and the signal line, whereby, driving capability of a transistor is decreased in the case where the gate insulating layer is simply formed thick.

SUMMARY OF THE INVENTION

In view of the foregoing problems, in a semiconductor device such as an active matrix display device, an object is to reduce the capacitance value of the parasitic capacitance without decreasing driving capability of a transistor. Further, another object is to provide a semiconductor device in which the capacitance value of the parasitic capacitance was reduced at low cost.

In the present invention disclosed, an insulating layer other than a gate insulating layer is provided between a wiring which is formed of the same material layer as a gate electrode of the transistor and a wiring which is formed of the same material layer as a source electrode or a drain electrode.

An embodiment of the present invention disclosed in this specification is a method for manufacturing a semiconductor device including the steps of: forming a first conductive layer over a substrate; selectively forming a resist mask with plural thicknesses over the first conductive layer; etching the first conductive layer using the resist mask and forming a gate electrode and a first wiring; making the resist mask recede to remove a resist mask over the gate electrode and leaving part of the resist mask over the first wiring; forming a gate insulating layer so as to cover the gate electrode, the first wiring, and the resist mask which is left; forming a second conductive layer over the gate insulating layer; selectively etching the second conductive layer to form a source and drain electrodes and forming a second wiring overlapping the first wiring in a region overlapped with the resist mask which is left; and forming a semiconductor layer which is in contact with the source and drain electrodes in a region overlapped with the gate electrode.

In the above description, an oxide semiconductor layer containing indium, gallium, and zinc may be formed as the semiconductor layer.

In the above description, the first wiring is preferably formed so that the width of the first wiring in a region overlapped with the resist mask which is left is smaller than the width of the first wiring in the other regions. Further, the second wiring is preferably formed so that the width of the second wiring in a region overlapped with the resist mask which is left is smaller than the width of the second wiring in the other regions.

In addition, the first wiring is preferably formed so that the thickness of the first wiring in the region overlapped with the resist mask which is left is larger than the thickness of the first wiring in the other regions. Further, the second wiring is preferably formed so that the thickness of the second wiring in the region overlapped with the resist mask which is left is larger than the thickness of the second wiring in the other regions. For example, another conductive layer is preferably formed over the second wiring. Note that the first wiring and the second wiring may have either a single-layer structure or a stacked-layer structure.

Note that in this specification, a semiconductor device refers to any device which can function by utilizing semiconductor characteristics; a display device, a semiconductor circuit, an electronic appliance are all included in the category of the semiconductor device.

According to one embodiment of the present invention disclosed, a resist mask used in forming the first wiring is partly left, whereby a capacitance value of parasitic capacitance formed by the first wiring and the second wiring is reduced. Thus, a semiconductor device in which the capacitance value of the parasitic capacitance is reduced can be provided while suppressing increase in the number of manufacturing steps.

Further, in the case where the width of the first wiring or the second wiring is small in a region where these wirings are overlapped with each other, the capacitance value of the parasitic capacitance can be further reduced.

On the other hand, in the case where the width of the wiring is locally small as described above, wiring resistance in the region is increased. In order to solve this problem, the thickness of the wiring in the region is preferably increased. In the case where a thickness of a wiring is increased, an increase in local wiring resistance can be suppressed and characteristics of a semiconductor device can be maintained. Note that in the present invention disclosed, a thickness of a wiring can be increased while the number of steps can be suppressed.

Through the above steps, according to one embodiment of the present invention disclosed, a high-performance semiconductor device in which a capacitance value of parasitic capacitance is reduced can be provided at low cost.

BRIEF DESCRIPTION OF THE DRAWINGS

FIGS. 6A to 6C are cross-sectional views illustrating a method for manufacturing a semiconductor device of Embodiment 4.

FIGS. 7A to 7C are cross-sectional views illustrating a method for manufacturing a semiconductor device of Embodiment 4.

FIGS. 11A-1, 11A-2 and 11B are views illustrating a semiconductor device of Embodiment 6.

FIGS. 15A and 15B are views illustrating a semiconductor device of Embodiment 8.

DETAILED DESCRIPTION OF THE INVENTION

Figure 1A:
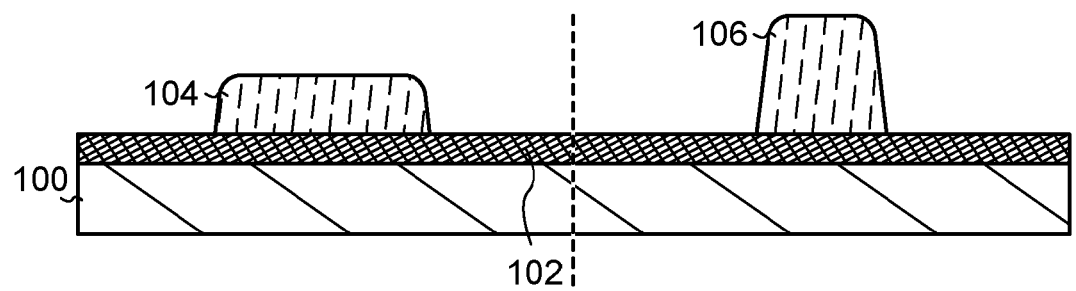
FIGS. 1A to 1D are cross-sectional views illustrating a method for manufacturing a semiconductor device of Embodiment 1.

Embodiments are described in detail with reference to the accompanying drawings. Note that the present invention is not limited to the description in the embodiments below, and it is apparent to those skilled in the art that modes and details of the present invention can be changed in various ways without departing from its spirit. In addition, structures according to different embodiments can be implemented in combination as appropriate. Note that in the structures of the invention described below, the same portions or portions having similar functions are denoted by the same reference numerals, and repetitive description thereof is omitted.

Embodiment 1

In this embodiment, an example of a method for manufacturing a semiconductor device is described with reference to drawings.

First, a conductive layer 102 is formed over a substrate 100 and resist masks 104 and 106 are selectively formed over the conductive layer 102 (see FIG. 1A). Note that in this embodiment, the resist mask 106 is formed thicker than the resist mask 104.

Any substrate can be used for the substrate 100 as long as it is a substrate having an insulating surface, for example, a glass substrate. It is preferable that the glass substrate be a non-alkali glass substrate. As a material of the non-alkali glass substrate, a glass material such as aluminosilicate glass, aluminoborosilicate glass, barium borosilicate glass, or the like is used, for example. Besides, as the substrate 100, an insulating substrate formed of an insulator such as a ceramic substrate, a quartz substrate, or a sapphire substrate, a semiconductor substrate formed of a semiconductor material such as silicon, over which an insulating material is covered, a conductive substrate formed of a conductive material such as metal or stainless steel, over which an insulating material is covered can be used. A plastic substrate can also be used as long as it can withstand thermal treatment in a manufacturing step.

The conductive layer 102 is preferably formed of a conductive material such as aluminum (Al), copper (Cu), molybdenum (Mo), tungsten (W), titanium (Ti). As a formation method, a sputtering method, a vacuum evaporation, a CVD method, and the like are given. In the case of using aluminum (or copper) for the conductive layer 102, since aluminum itself (or copper itself) has disadvantages such as low heat resistance and a tendency to be corroded, it is preferably formed in combination with a conductive material having heat resistance.

As the conductive material having heat resistance, it is possible to use metal containing an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, a nitride containing any of these elements as its component, or the like. The conductive material having heat resistance and aluminum (or copper) may be stacked, whereby the conductive layer 102 may be formed.

The resist masks 104 and 106 can be formed using a multi-tone mask. Here, the multi-tone mask is a mask capable of light exposure with multi-level light intensity. With the use of a multi-tone mask, one-time exposure and development process allow a resist mask with plural thicknesses (typically, two kinds of thicknesses) to be formed. By use of the multi-tone mask, the number of steps can be suppressed.

For example, in order to form a resist mask with two kinds of thicknesses, light exposure is preferably performed using a multi-tone mask which is irradiated with three levels of light intensity to provide an exposed region, a half-exposed region, and an unexposed region.

As a multi-tone mask, a gray-tone mask and a half-tone mask are given. A gray-tone mask can have a structure having a light blocking portion formed using a light blocking layer, a slit portion provided by a predetermined pattern of the light blocking film, and a transmitting portion where these are not provided, over a substrate having a light-transmitting property. A half-tone mask can have a structure having a light blocking portion formed using a light blocking layer, a semi-transmitting portion formed using a semi-transmissive film, and a transmitting portion where these are not provided, over a substrate having a light-transmitting property.

The light blocking film for forming the light blocking portion and the slit portion may be formed using a metal material, and for example, the light blocking film is preferably formed using chromium, chromium oxide, or the like.

In addition, the slit portion has slits (including dots, meshes, or the like) which are provided in size which is less than or equal to the diffraction limit (also referred to as a resolution limit) of light used for exposure. Thus, light transmittance is controlled. Note that the slit portion 143 may have slits with either regular or irregular intervals.

The semi-light-transmitting portion can be formed using MoSiN, MoSi, MoSiO, MoSiON, CrSi, or the like having a light-transmitting property.

By light exposure using such a multi-tone mask and development, the resist masks 104 and 106 having different thicknesses can be formed.

Note that a method for manufacturing the resist masks 104 and 106 are not limited to the above method. The above resist masks may be formed by a method by which films having different thicknesses can be selectively formed such as an ink-jet method.

Figure 1B:
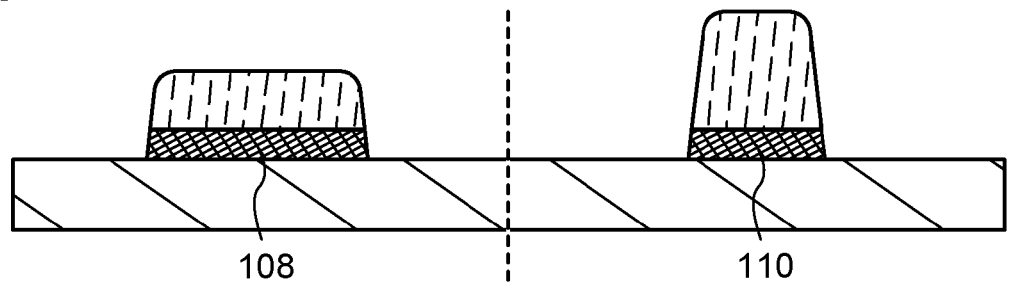

Next, the conductive layer 102 is etched using the above resist masks 104 and 106, so that a gate electrode 108 and a first wiring 110 are formed (see FIG. 1B).

As the above etching treatment, dry etching may be used, or wet etching may be used. In order to improve coverage of a gate insulating layer or the like which is formed later and prevent disconnection, the etching is preferably performed so that end portions of the gate electrode 108 and the first wiring 110 are tapered. For example, the end portions are preferably tapered at a taper angle 20° or more and less than 90°. Here, the "taper angle" refers to an angle formed by a side surface of a layer which is tapered to a bottom surface thereof when the layer having a tapered shape is observed from a cross-sectional direction.

Figure 1C:
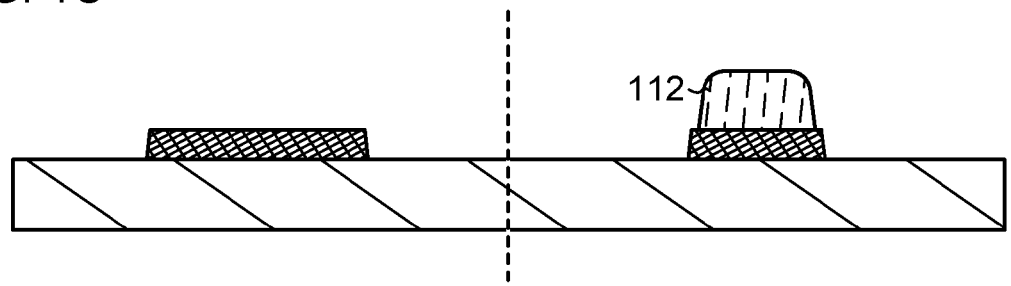

Next, the resist masks 104 and 106 are made to recede to expose a surface of the gate electrode 108, whereby a resist mask 112 is formed over the first wiring 110 (see FIG. 1C). As a method for making the resist masks 104 and 106 to recede, for example, ashing treatment using oxygen plasma can be given; however, the present invention disclosed is not interpreted as being limited to the method.

Figure 1D:
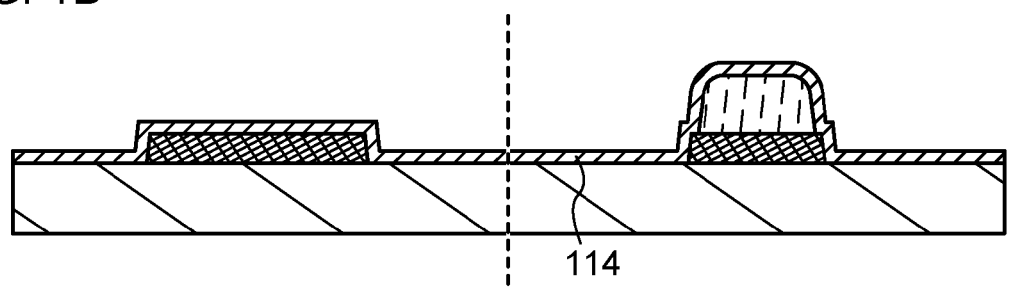

Next, a gate insulating layer 114 is formed so as to cover the gate electrode 108, the first wiring 110, and the resist mask 112 (see FIG. 1D). The gate insulating layer 114 can be formed using a material such as silicon oxide, silicon oxynitride, silicon nitride, silicon nitride oxide, aluminum oxide, or tantalum oxide. The insulating layer 114 may also be formed by stacking films formed of these materials. These films are preferably formed to a thickness of greater than or equal to 5 nm and less than or equal to 250 nm by a sputtering method or the like. For example, as the gate insulating layer 114, a silicon oxide film can be formed to a thickness of 100 nm by a sputtering method.

Alternatively, the gate insulating layer 114 with a stacked-layer structure may be formed by combination of a sputtering method and a CVD method (a plasma CVD method or the like). For example, a lower layer of the gate insulating layer 114 (a region in contact with the gate electrode 108) is formed by a plasma CVD method and an upper layer of the gate insulating layer 114 is formed by a sputtering method. Since a film with favorable step coverage is easily formed by a plasma CVD method, it is suitable for a method for forming a film just above the gate electrode 108. In the case of using a sputtering method, since it is easy to reduce hydrogen concentration in the film as compared to the case of using a plasma CVD method, by providing a film by a sputtering method in a region in contact with a semiconductor layer, the hydrogen in the gate insulating layer 114 can be prevented from being diffused into the semiconductor layer. In particular, in the case where a semiconductor layer is formed using an oxide semiconductor material, since it is considered that hydrogen has a great influence on characteristics, it is effective to employ such a structure.

Note that in this specification, oxynitride refers to a substance that contains more oxygen (number of atoms) than nitrogen. For example, silicon oxynitride is a substance containing oxygen, nitrogen, silicon, and hydrogen in ranges of 50 atomic % to 70 atomic %, 0.5 atomic % to 15 atomic %, 25 atomic % to 35 atomic %, and 0.1 atomic % to 10 atomic %, respectively. Further, nitride oxide refers to a substance that contains more nitrogen (number of atoms) than oxygen. For example, silicon nitride oxide is a substance containing oxygen, nitrogen, silicon, and hydrogen in ranges of 5 atomic % to 30 atomic %, 20 atomic % to 55 atomic %, 25 atomic % to 35 atomic %, and 10 atomic % to 25 atomic %, respectively. Note that the above ranges are ranges for cases where measurement is performed using Rutherford backscattering spectrometry (RBS) and hydrogen forward scattering spectrometry (HFS). Moreover, the total for the content ratio of the constituent elements does not exceed 100 atomic %.

Figure 2A:
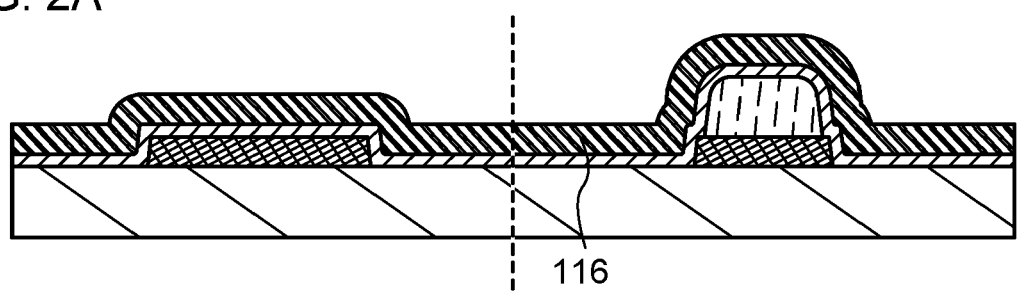
FIGS. 2A to 2C are cross-sectional views illustrating a method for manufacturing a semiconductor device of Embodiment 1.

Next, a conductive layer 116 is formed over a gate insulating layer 114 (see FIG. 2A). The conductive layer 116 can be formed using a material and by a method which are similar to those of the conductive layer 102. For example, the conductive layer 116 can be formed to have a single-layer structure of a molybdenum film or a titanium film. Alternatively, the conductive layer 116 may be formed to have a stacked-layer structure and can have a stacked-layer structure of an aluminum film and a titanium film, for example. A three-layer structure in which a titanium film, an aluminum film, and a titanium film are stacked in this order may be employed. A three-layer structure in which a molybdenum film, an aluminum film, and a molybdenum film are stacked in this order may be employed. Further, an aluminum film containing neodymium (an Al—Nd film) may be used as the aluminum film used for these stacked-layer structures. Further alternatively, the conductive layer 116 may have a single-layer structure of an aluminum film containing silicon.

Figure 2B:
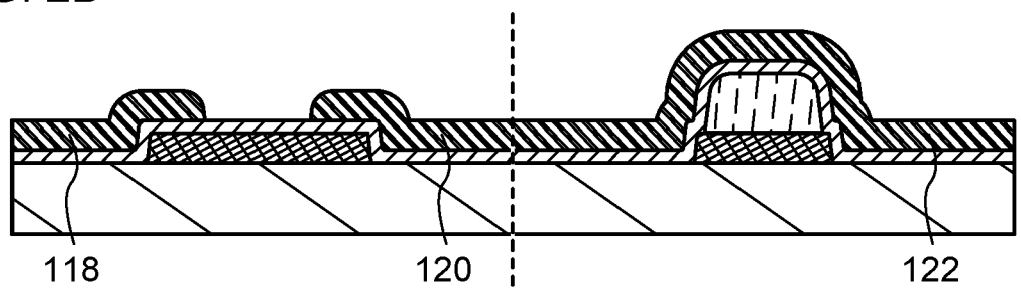

Next, the conductive layer 116 is selectively etched to form a source electrode 118, a drain electrode 120, and a second wiring 122 (see FIG. 2B).

Note that the source electrode 118 may function as the drain electrode and the drain electrode 120 may function as the source electrode depending on a method for driving a transistor. Therefore, denominations of source and drain can be switched depending on the function or the condition. In addition, these denominations are ones of convenience and are not ones which determine their functions.

Although not described in this embodiment, after the above steps, the gate insulating layer 114, the source electrode 118, and the drain electrode 120 may be subjected to surface treatment. As the surface treatment, plasma treatment using an inactive gas and/or a reactive gas or the like can be applied.

Plasma treatment can be, for example, performed in a plasma state by introducing an inert gas such as an argon (Ar) gas into a chamber in a vacuum state and applying a bias voltage to an object. When an Ar gas is introduced into a chamber, electrons and Ar cations are present in plasma, and the Ar cations are accelerated in a cathode direction. The accelerated Ar cations collide with surfaces of the gate insulating layer 114, the source electrode 118, and the drain electrode 120 which are formed over the substrate 100, whereby the surfaces are etched by sputtering and the surfaces of the gate insulating layer 114, the source electrode 118, and the drain electrode 120 can be modified. Note that such plasma treatment may also be called "reverse sputtering" treatment.

When plasma treatment is performed by application of bias voltage to the substrate 100 side, the surfaces of the gate insulating layer 114, the source electrode 118, and the drain electrode 120 can be effectively etched by sputtering. In addition, when projections and depressions are formed on the surface of the gate insulating layer 114, the projections of the gate insulating layer 114 are preferentially etched by sputtering by plasma treatment, so that the planarity of the surface of the gate insulating layer 114 can be improved.

As the above plasma treatment, a helium gas can be used in addition to an argon gas. Alternatively, an atmosphere in which oxygen, hydrogen, nitrogen, or the like is added to an argon gas or a helium gas may be used. Further alternatively, an atmosphere in which $Cl_2$, $CF_4$, or the like is added to an argon gas or a helium gas may be used.

Figure 2C:
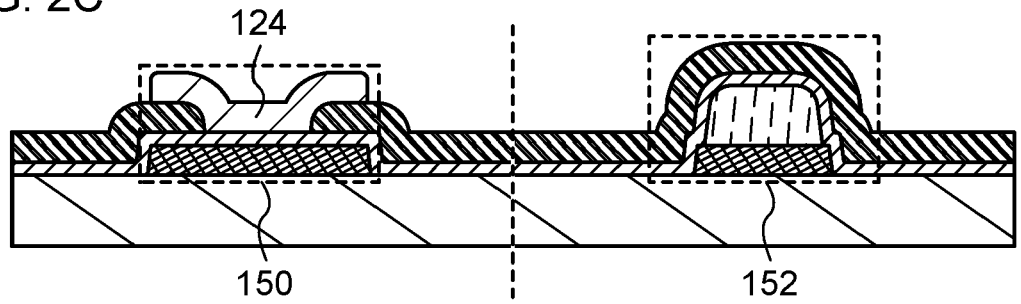

Next, after a semiconductor layer is formed so as to cover the gate insulating layer 114, the source electrode 118, and the drain electrode 120, the semiconductor layer is selectively etched, so that an island-shape semiconductor layer 124 is formed in which at least part thereof is in contact with the source electrode 118 and the drain electrode 120 (see FIG. 2C). There is no particular limitation on a material used for the island-shape semiconductor layer 124. The island-shape semiconductor layer 124 can be formed using, for example, a silicon-based semiconductor material such as single crystal silicon, polycrystalline silicon or amorphous silicon, a germanium-based semiconductor material, or the like. Alternatively, a compound semiconductor material such as silicon germanium, silicon carbide, gallium arsenide, or indium phosphide may be used. In particular, when an oxide semiconductor material (a metal oxide semiconductor material) is used, a semiconductor device with excellent characteristics can be provided. In this embodiment, the case where an oxide semiconductor material is used as the island-shape semiconductor layer 124 is described.

Note that as an example of the above oxide semiconductor material, one represented by $InMO_3 (ZnO)_m$ (m>0) is given. Here, M denotes one or more of metal elements selected from gallium (Ga), iron (Fe), nickel (Ni), manganese (Mn), and cobalt (Co). For example, when Ga is selected as M, the case where the above metal element other than Ga, such as Ga and Ni or Ga and Fe, is included in addition to the case where only Ga is selected. Moreover, in the above oxide semiconductor, in some cases, a transition metal element such as Fe or Ni or an oxide of the transition metal is contained as an impurity element in addition to a metal element contained as M. Needless to say, the oxide semiconductor material is not limited to the above materials and a variety of oxide semiconductor materials such as zinc oxide or indium oxide can be used.

An insulating impurity may be contained in the oxide semiconductor. As the impurity, insulating oxide typified by silicon oxide, germanium oxide, aluminum oxide, or the like; insulating nitride typified by silicon nitride, aluminum nitride, or the like; or insulating oxynitride such as silicon oxynitride or aluminum oxynitride is applied.

The insulating oxide or the insulating nitride is added to the oxide semiconductor at a concentration at which electrical conductivity of the oxide semiconductor does not deteriorate.

Insulating impurity is contained in the oxide semiconductor, whereby crystallization of the oxide semiconductor can be suppressed. The crystallization of the oxide semiconductor is suppressed, whereby characteristics of the thin film transistor can be stabilized. For example, an In—Ga—Zn—O-based oxide semiconductor is made to contain the impurity such as silicon oxide. Thus, crystallization of the oxide semiconductor or generation of microcrystal grains can be prevented even by heat treatment at 300° C. to 600° C.

In a manufacturing process of a thin film transistor in which an In—Ga—Zn—O-based oxide semiconductor layer is a channel formation region, an S value (a subthreshold swing value) or field effect mobility can be improved by heat treatment. Even in such a case, crystallization and generation of microcrystal grains can be prevented as described above, whereby the thin film transistor can be prevented from being normally-on. Further, even in the case where heat stress or bias stress is added to the thin film transistor, variations in a threshold voltage can be prevented.

In the case where the island-shape semiconductor layer 124 is formed using an In—Ga—Zn—O-based oxide semiconductor as an oxide semiconductor material, for example, a sputtering method using an oxide semiconductor target containing In, Ga, and Zn ($In_2O_3:Ga_2O_3:ZnO=1:1:1$) can be employed. The sputtering can be performed under the following conditions, for example; the distance between the substrate 100 and the target is 30 mm to 500 mm; the pressure is 0.1 Pa to 2.0 Pa; direct current (DC) power supply is 0.25 kW to 5.0 kW; the temperature is 20° C. to 100° C.; the atmosphere is a rare gas atmosphere such as argon, an oxide atmosphere, or a mixed atmosphere of a rare gas such as argon and oxide.

Alternatively, in the case where the island-shape semiconductor layer 124 is formed using an In—Ga—Zn—O-based oxide semiconductor by a sputtering method, insulating impurity may be contained in the oxide semiconductor target containing In, Ga, and Zn. The impurity is insulating oxide typified by silicon oxide, germanium oxide, aluminum oxide, or the like; insulating nitride typified by silicon nitride, aluminum nitride, or the like; or insulating oxynitride typified by silicon oxynitride or aluminum oxynitride. For example, $SiO_2$ is preferably contained at a percentage of 0.1 wt % to 10 wt %, more preferably a percentage of 1 wt % to 6 wt % in the oxide semiconductor target. Insulating impurity is contained in the oxide semiconductor, whereby the oxide semiconductor to be formed is easily made amorphous. Further, when heat treatment is performed on the oxide semiconductor film, the oxide semiconductor film can be prevented from being crystallized.

In this embodiment, the case where the island-shape semiconductor layer 124 using an oxide semiconductor material having a single layer is formed is described; however, the island-shape semiconductor layer 124 may have a stacked-layer structure. For example, a semiconductor layer (hereinafter called a "semiconductor layer with high conductivity")

having the same constituent element as and a different constituent ratio thereof from the above semiconductor layer 124 is formed over the conductive layer 116. When etching in which a source electrode and a drain electrode are formed is performed, the semiconductor layer is etched, and after that, a semiconductor layer (hereinafter called a "semiconductor layer with normal conductivity") having the same constituent as the above semiconductor layer 124 is formed. Thus, this structure can be employed instead of the above structure. In this case, since the semiconductor layer with high conductivity is provided between the source electrode (or the drain electrode) and the semiconductor layer with normal conductivity, element characteristics can be improved.

Film formation conditions of the semiconductor layer with high conductivity and the semiconductor layer with normal conductivity are preferably different. For example, a flow rate ratio of an oxygen gas to an argon gas in the film formation conditions of the semiconductor layer with high conductivity is smaller than that in the film formation conditions of the semiconductor layer with normal conductivity. Specifically, the semiconductor layer with high conductivity is formed in a rare gas (such as argon or helium) atmosphere or an atmosphere containing an oxygen gas at 10% or less and a rare gas at 90% or more. The semiconductor layer with normal conductivity is formed in an oxygen atmosphere or an atmosphere in which a flow rate of an oxygen gas is 1 time or more that of a rare gas. In such a manner, two kinds of semiconductor layers having different conductivities can be formed.

Note that a pulse direct current (DC) power supply is preferably used because dust can be reduced and the film thickness can be uniform. Further, in the case where the island-shape semiconductor layer 124 is formed without being exposed to the air after the above-described plasma treatment, dust or moisture can be prevented from being attached to an interface between the gate insulating layer 114 and the island-shape semiconductor layer 124. In addition, attachment of impurities to surfaces of the source electrode 118 and the drain electrode 120, oxidation of the surfaces, or the like can be suppressed. Note that the thickness of the island-shape semiconductor layer 124 may be about 5 nm to 200 nm.

As the above sputtering method, an RF sputtering method in which a high-frequency power source is used for a sputtering power source, a DC sputtering method in which a direct current power source is used, a pulse DC sputtering method in which a direct-current bias is applied in a pulse manner, or the like can be employed.

Through the above steps, a transistor 150 in which the island-shape semiconductor layer 124 is used as a channel formation region can be formed. Further, in a region where a second wiring 122 is overlapped with a first wiring 110 (a region where the first wiring 110 and the second wiring 122 intersect with each other), a stacked-layer structure 152 of the first wiring 110, the resist mask 112, the gate insulating layer 114, and the second wiring 122 can be formed. Thus, a capacitance value of parasitic capacitance can be reduced while suppressing increase in the number of manufacturing steps.

Note that heat treatment at 100° C. to 800° C., typically 200° C. to 400° C., is preferably performed after the island-shape semiconductor layer 124 using an oxide semiconductor material is formed. For example, heat treatment can be performed at 350° C. for an hour in a nitrogen atmosphere. Through this heat treatment, rearrangement at the atomic level of the In—Ga—Zn—O-based oxide semiconductor included in the island-shape semiconductor layer 124 occurs. This heat treatment (including photo-annealing and the like) is important in terms of releasing distortion which interrupts carrier movement in the island-shape semiconductor layer 124. Note that there is no particular limitation on the timing of the above heat treatment as long as it is after the island-shape semiconductor layer 124 (or the semiconductor layer before the etching) is formed.

The island-shape semiconductor layer 124 using an oxide semiconductor material may be subjected to oxygen radical treatment. The transistor 150 is easily normally off by oxygen radical treatment. In addition, the radical treatment can repair damage due to the etching of the island-shape semiconductor layer 124. The radical treatment can be performed in an atmosphere of $O_2$, $N_2O$, $N_2$ containing oxygen, He, Ar, or the like. Alternatively, the radical treatment may be performed in an atmosphere in which $Cl_2$ and $CF_4$ are added to the above atmosphere. Note that the radical treatment is preferably performed without application of bias voltage to the substrate 100 side.

After that, a protective insulating layer (not shown) is formed so as to cover the transistor 150 and the stacked-layer structure 152. The protective insulating layer may be formed by a single layer or a stacked layer of a film formed of a material such as silicon oxide, silicon nitride, silicon oxynitride, silicon nitride oxide, aluminum oxide, aluminum nitride, aluminum oxynitride, or aluminum nitride oxide by a CVD method, a sputtering method, or the like. Alternatively, the protective insulating layer may be formed by a film formed of an organic material having heat resistance such as polyimide, acrylic, benzocyclobutene, polyamide, or epoxy by a spin coating method, a droplet discharge method (e.g., an ink-jet method, screen printing, offset printing), or the like. In addition to such organic materials, a low-dielectric constant material (a low-k material), a siloxane-based resin, PSG (phosphosilicate glass), BPSG (borophosphosilicate glass), or the like can be used as well. Note that a siloxane-based resin is a resin formed from a siloxane-based material as a starting material and having the bond of Si—O—Si. As a substituent, an organic group (e.g., an alkyl group or an aryl group) or a fluoro group may be used. The organic group may include a fluoro group.

After that, a variety of electrodes and a wiring are formed, whereby a semiconductor device provided with the transistor 150 is completed.

As described in this embodiment, part of the resist mask formed using a multi-tone mask is provided between the first wiring and the second wiring, whereby the capacitance value of the parasitic capacitance can be reduced while suppressing increase in the number of manufacturing steps.

Note that this embodiment can be implemented in combination with any of the other embodiments or example as appropriate.

Embodiment 2

In this embodiment, an example, which is different from the above embodiment, of a method for manufacturing a semiconductor device is described with reference to drawings. Note that many parts of a step of manufacturing a semiconductor device in this embodiment are the same as those in the other embodiments. Therefore, hereinafter, description for the same parts as those of the above embodiment is omitted and different parts from the above embodiment are described in detail.

Figure 3A:
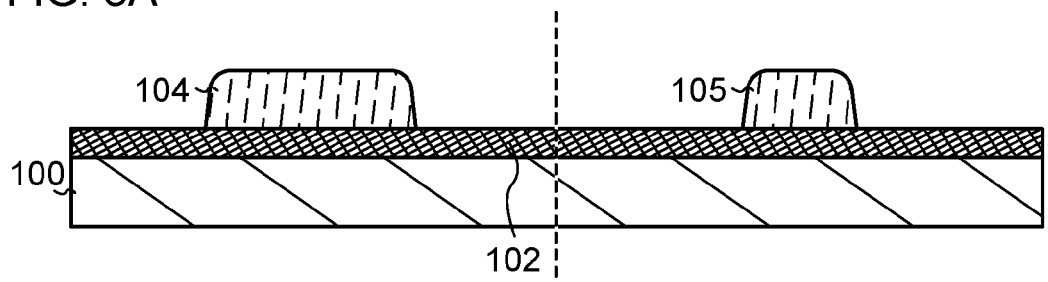
FIGS. 3A to 3D are cross-sectional views illustrating a method for manufacturing a semiconductor device of Embodiment 2.

First, the conductive layer 102 is formed over the substrate 100 and the resist masks 104 and 105 are selectively formed over the conductive layer 102 (see FIG. 3A). Note that in this embodiment, the resist mask 104 and the resist mask 105 are the almost same thickness.

Embodiment 1 can be referred to for the details of the substrate 100 and the conductive layer 102; therefore description thereof is omitted here.

The resist masks 104 and 105 can be manufactured without using any special method. Needless to say, a multi-tone mask may be used, or an ink-jet method may be used.

Figure 3B:
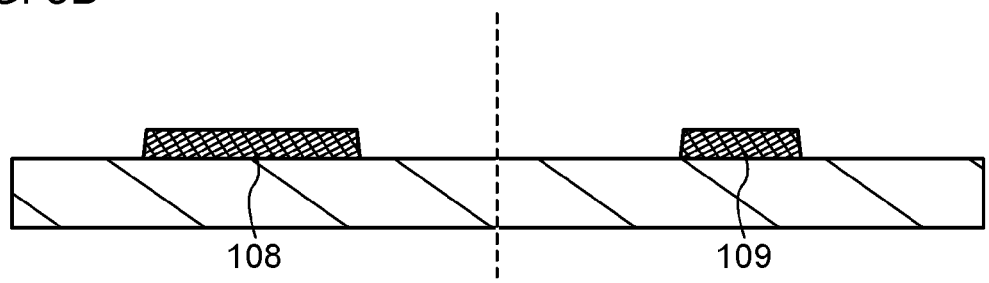

Next, the conductive layer 102 is etched using the resist masks 104 and 105, so that the gate electrode 108 and a first wiring 109 are formed (see FIG. 3B).

Embodiment 1 can also be referred to for the detail of the above etching treatment. Note that after the above etching treatment, the resist masks 104 and 105 are removed.

Figure 3C:
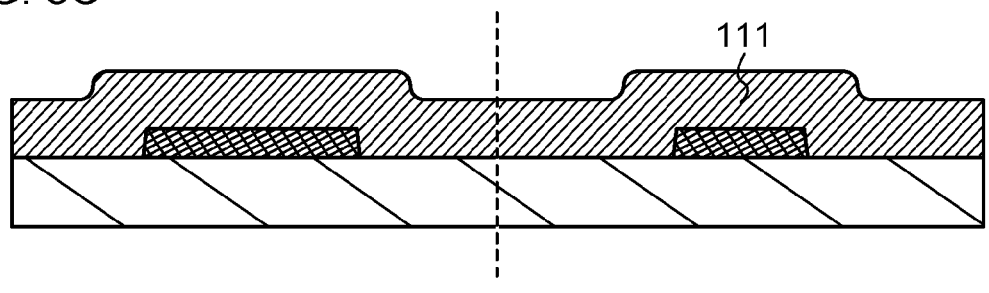

Next, an insulating layer 111 is formed so as to cover the gate electrode 108 and the first wiring 109 (see FIG. 3C). The gate insulating layer 111 can be formed using a material such as silicon oxide, silicon oxynitride, silicon nitride, silicon nitride oxide, aluminum oxide, and tantalum oxide. Alternatively, an organic material having heat resistance, such as polyimide, acrylic, benzocyclobutene, polyamide, or epoxy can be used. In addition to such organic materials, a low-dielectric constant material (a low-k material), a siloxane-based resin, PSG (phosphosilicate glass), BPSG (borophosphosilicate glass), or the like can be used. Alternatively, the insulating layer 111 may be formed by stacking films formed of these materials. In particular, a low-dielectric constant material is preferably used because the parasitic capacitance can be effectively reduced. These films are formed to a thickness of greater than or equal to 50 nm, preferably greater than or equal to 200 nm, more preferably greater than or equal to 500 nm by a sputtering method or the like. For example, a silicon oxide film can be formed to a thickness of 250 nm by a sputtering method as the insulating layer 111.

Figure 3D:
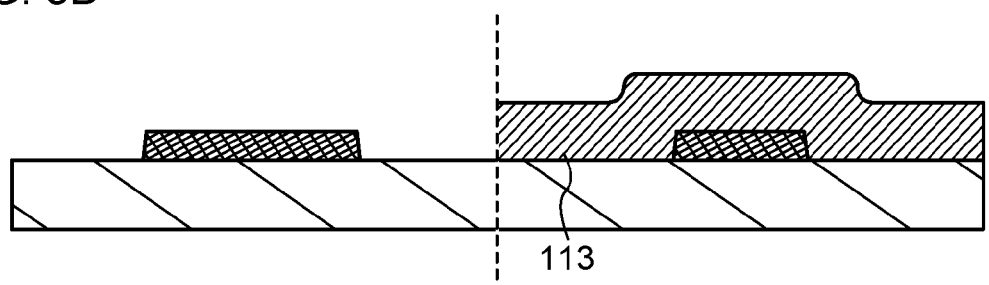

Next, the above insulating layer 111 is selectively etched to form an insulating layer 113 covering the first wiring 109 (see FIG. 3D). As the above etching treatment, dry etching may be used, or wet etching may be used. By the etching treatment, a surface of the gate electrode 108 is exposed.

Figure 4A:
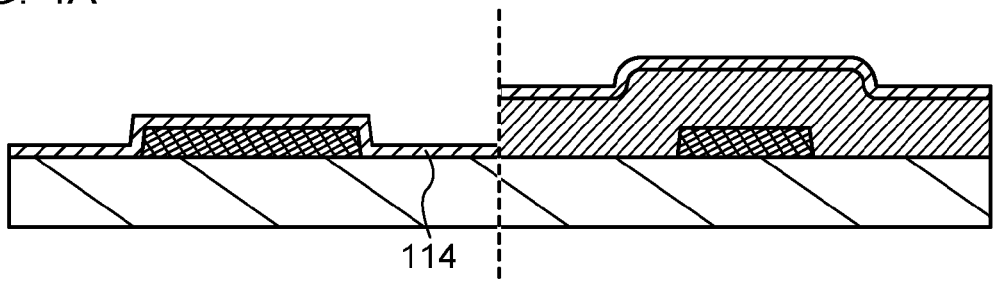
FIGS. 4A to 4D are cross-sectional views illustrating a method for manufacturing a semiconductor device of Embodiment 2.

Next, the gate insulating layer 114 is formed so as to cover the gate electrode 108, the insulating layer 113, and the like (see FIG. 4A). Embodiment 1 can be referred to for the detail of the gate insulating layer 114.

Figure 4B:
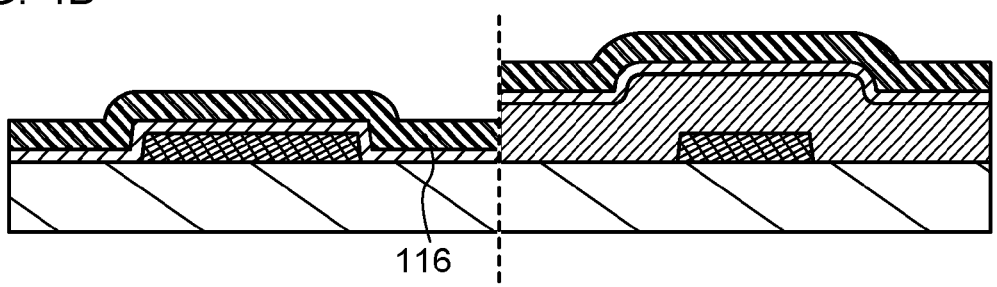

Next, the conductive layer 116 is formed over the gate insulating layer 114 (see FIG. 4B). The conductive layer 116 can be formed using a material and by a method which are similar to those of the conductive layer 102. For example, the conductive layer 116 can be formed to have a single-layer structure of a molybdenum film or a titanium film. Alternatively, the conductive layer 116 may be formed to have a stacked-layer structure and can have a stacked-layer structure of an aluminum film and a titanium film, for example. A three-layer structure in which a titanium film, an aluminum film, and a titanium film are stacked in this order may be employed. A three-layer structure in which a molybdenum film, an aluminum film, and a molybdenum film are stacked in this order may be employed. Further, an aluminum film containing neodymium (an Al—Nd film) may be used as the aluminum film used for these stacked-layer structures. Further alternatively, the conductive layer 116 may have a single-layer structure of an aluminum film containing silicon.

Figure 4C:
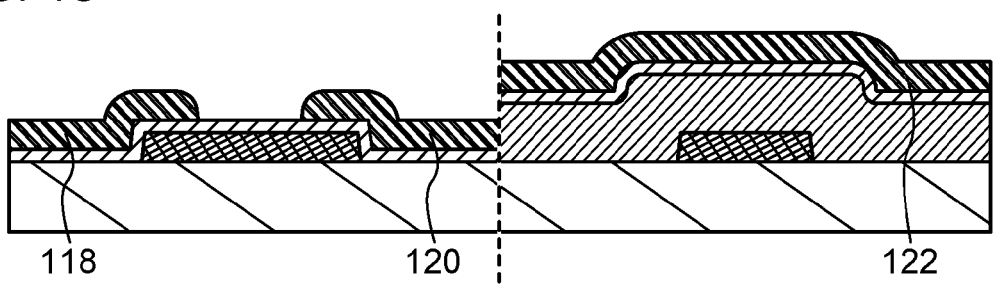

Next, the conductive layer 116 is selectively etched to form the source electrode 118, the drain electrode 120, and the second wiring 122 (see FIG. 4C).

Although not described in this embodiment, after the above steps, the gate insulating layer 114, the source electrode 118, and the drain electrode 120 may be subjected to surface treatment. As the surface treatment, plasma treatment using an inactive gas and/or a reactive gas or the like can be performed. Embodiment 1 can be referred to for the detail of the plasma treatment.

Figure 4D:
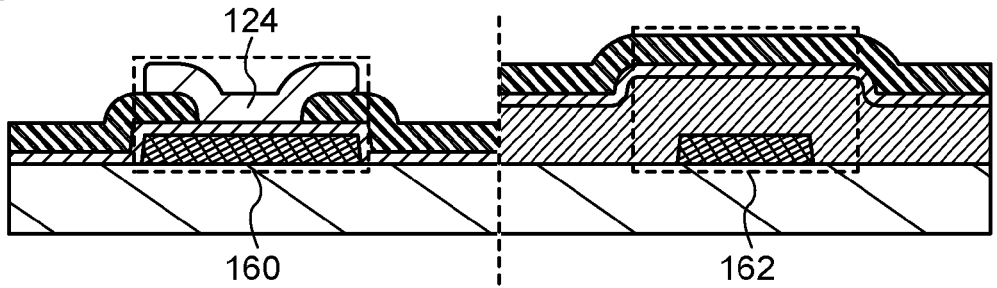

Next, after a semiconductor layer is formed so as to cover the gate insulating layer 114, the source electrode 118, and the drain electrode 120, the semiconductor layer is selectively etched, so that the island-shape semiconductor layer 124 is formed in which at least part thereof is in contact with the source electrode 118 and the drain electrode 120 (see FIG. 4D). Embodiment 1 may be referred to for the detail of the island-shape semiconductor layer 124. Note that in this embodiment, the case where an oxide semiconductor material is used as the island-shape semiconductor layer 124 is described.

Note that also in this embodiment, the semiconductor layer can have a stacked-layer structure as described in Embodiment 1. The semiconductor layer with high conductivity is provided in a portion which is in contact with the source electrode (or the drain electrode), whereby element characteristics can be improved.

Besides, Embodiment 1 can be referred to for the detail of forming the island-shape semiconductor layer 124. Embodiment 1 can be referred to for the details of a variety of treatment on the island-shape semiconductor layer 124 as well.

Through the above steps, a transistor 160 in which the island-shape semiconductor layer 124 is used as a channel formation region can be formed. Further, in a region where the second wiring 122 is overlapped with the first wiring 109 (a region where the first wiring 109 and the second wiring 122 intersect with each other), a stacked-layer structure 162 of the first wiring 109, the insulating layer 113, the gate insulating layer 114, and the second wiring 122 can be formed. Thus, the capacitance value of the parasitic capacitance can be reduced.

After that, a protective insulating layer (not shown) is formed so as to cover the transistor 160 and the stacked-layer structure 162. Embodiment 1 can be referred to for the details. Then, a variety of electrodes and a wiring are formed, whereby a semiconductor device provided with the transistor 160 is completed.

As described in this embodiment, an insulating layer other than a gate insulating layer is provided between the first wiring and the second wiring, whereby the capacitance value of the parasitic capacitance can be reduced without increasing the thickness of the gate insulating layer. In other words, the capacitance value of the parasitic capacitance can be reduced without deteriorating element characteristics.

Note that this embodiment can be implemented in combination with any of the other embodiments or example as appropriate.

Embodiment 3

In this embodiment, an example, which is different from the above embodiments, of a step of manufacturing a semiconductor device is described with reference to drawings. Note that many parts of a method for manufacturing a semiconductor device in this embodiment are the same as those in the other embodiments. Therefore, description for the same parts as those of the above embodiments is omitted and different parts from the above embodiments are described in detail.

Figure 5A:
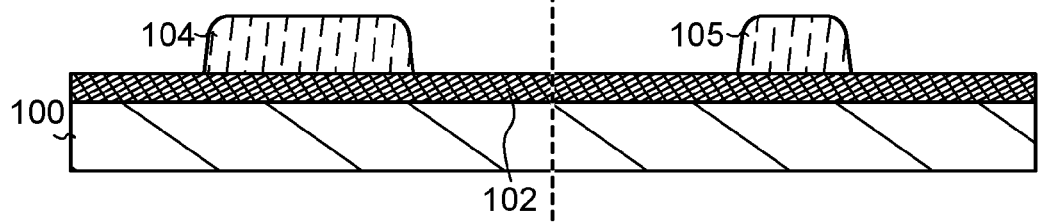
FIGS. 5A to 5E are cross-sectional views illustrating a method for manufacturing a semiconductor device of Embodiment 3.

First, the conductive layer 102 is formed over the substrate 100 and the resist masks 104 and 105 are selectively formed over the conductive layer 102 (see FIG. 5A). Note that in this embodiment, the resist mask 104 and the resist mask 105 are the almost same thickness.

Embodiment 1 can be referred to for the details of the substrate 100 and the conductive layer 102; therefore description thereof is omitted here.

The resist masks 104 and 105 can be manufactured without using any special method. Needless to say, a multi-tone mask may be used, or an ink-jet method may be used.

Figure 5B:
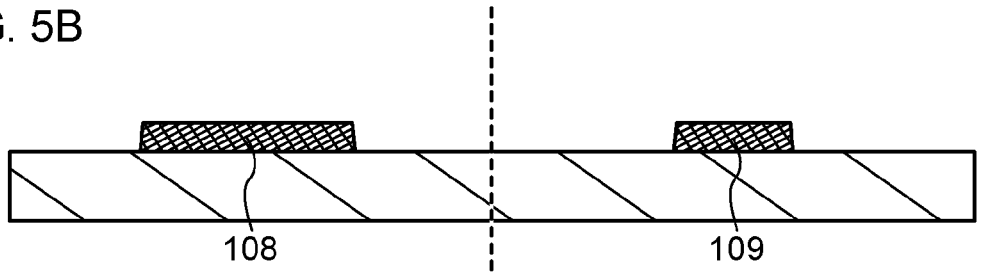

Next, the conductive layer 102 is etched using the resist masks 104 and 105, so that the gate electrode 108 and the first wiring 109 are formed (see FIG. 5B).

Embodiment 1 can also be referred to for the detail of the above etching treatment. Note that after the above etching treatment, the resist masks 104 and 105 are removed.

Figure 5C:
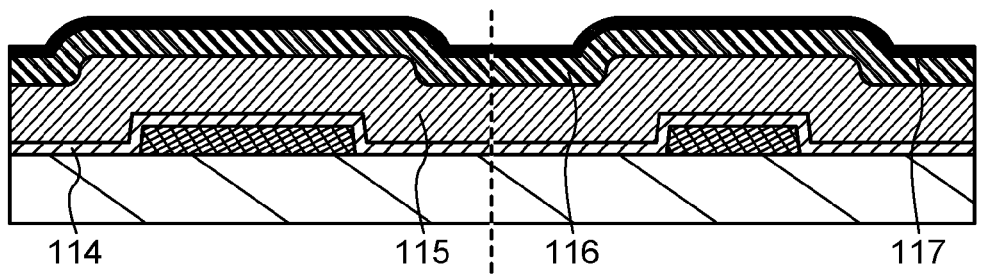

Next, the gate insulating layer 114, the insulating layer 115, the conductive layer 116, and a semiconductor layer 117 with high conductivity are stacked in this order so as to cover the gate electrode 108 and the first wiring 109 (see FIG. 5C).

Embodiment 1 or the like can be referred to for the details of the gate insulating layer 114 and the conductive layer 116. The detail of the insulating layer 111 in Embodiment 2 can be referred to for the insulating layer 115. In addition, the semiconductor layer 117 with high conductivity corresponds to the "semiconductor layer with high conductivity" in Embodiment 1 or the like.

A combination of the gate insulating layer 114 and the insulating layer 115 is preferably a combination in which a selectivity ratio in etching which is a later step can be obtained. For example, when silicon oxide and silicon nitride are combined, the selectivity ratio in etching can be preferably obtained. In this embodiment, the case where the gate insulating layer 114 is formed using silicon oxide and the insulating layer 115 is formed using silicon nitride is described.

The semiconductor layer 117 with high conductivity can be formed, for example, by a sputtering method using an oxide semiconductor target containing In, Ga, and Zn ($In_2O_3$: $Ga_2O_3$:ZnO=1:1:1). The sputtering can be performed under the following conditions, for example; the distance between the substrate 100 and the target is 30 mm to 500 mm; the pressure is 0.1 Pa to 2.0 Pa; direct current (DC) power supply is 0.25 kW to 5.0 kW; the temperature is 20° C. to 100° C.; the atmosphere is a rare gas atmosphere such as argon, or a mixed atmosphere of a rare gas such as argon and oxide.

More specifically, the above semiconductor layer 117 with high conductivity is preferably formed under a condition where the flow rate of oxygen is small. For example, the atmosphere can be a rare gas (such as argon or helium) atmosphere or an atmosphere containing an oxygen gas at 10% or less and a rare gas at 90% or more. Thus, the oxygen concentration of the film formation atmosphere is reduced, whereby a semiconductor layer with high conductivity can be obtained.

In the above description, the case where an oxide semiconductor material is used for the semiconductor layer of the transistor is described as an example; however, a semiconductor material such as silicon, germanium, silicon germanium, silicon carbide, gallium arsenide, or indium phosphide may be used. For example, in the case of using silicon for the semiconductor layer of the transistor, the semiconductor layer 117 with high conductivity can be formed using a material in which phosphorus (P), boron (B), or the like is added to silicon.

The semiconductor layer 117 with high conductivity is provided, whereby element characteristics can be improved. However, the semiconductor layer 117 with high conductivity is not a necessary component and can be omitted as appropriate.

Figure 5D:
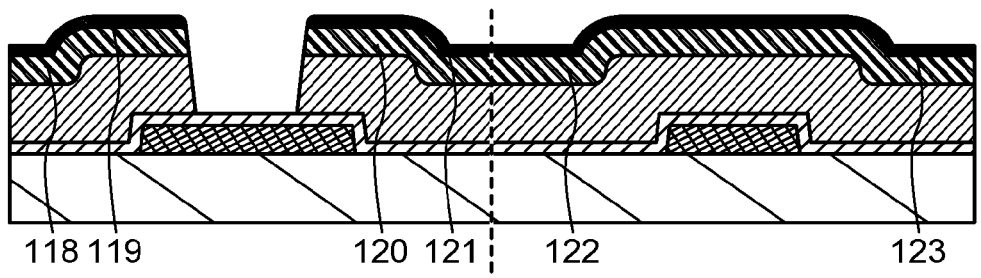

Next, The insulating layer 115, the conductive layer 116, and the semiconductor layer 117 with high conductivity are selectivity etched, so that the source electrode 118, a semiconductor layer 119 with high conductivity, the drain electrode 120, a semiconductor layer 121 with high conductivity, the second wiring 122, and a semiconductor layer 123 with high conductivity are formed (see FIG. 5D).

As described above, the etching treatment is preferably performed under a condition in which the insulating layer 115 is etched more easily than the gate insulating layer 114 can be obtained. It is extremely important to perform the etching treatment under the condition where the insulating layer 115 is etched more easily than the gate insulating layer 114 can be obtained. The reason for this is as follows. The thickness of the insulating layer 115 is larger than the thickness of the gate insulating layer 114. In the case where etching treatment is performed under the condition where the insulating layer 115 is etched less easily than the gate insulating layer 114, variations in thickness of the gate insulating layer 114 due to the etching of the gate insulating layer 114 are caused, and there is a concern that element characteristics are deteriorated. Note that there is no particular limitation on the etching treatment other than the above condition.

Figure 5E:
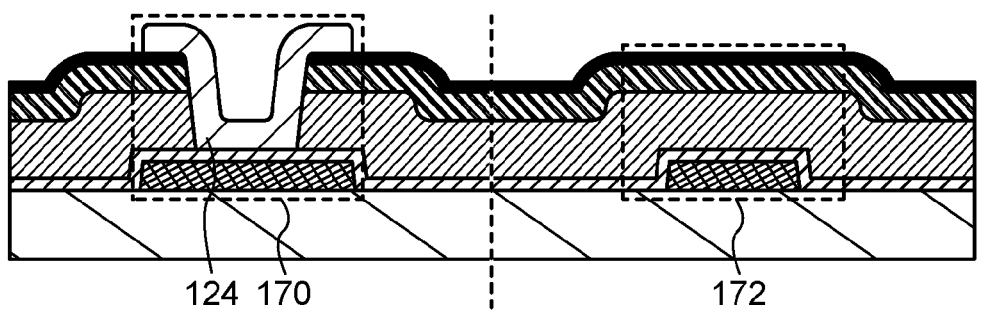

Next, after a semiconductor layer is formed so as to cover the gate insulating layer 114, the source electrode 118, the semiconductor layer 119 with high conductivity, the drain electrode 120, and the semiconductor layer 121 with high conductivity, the semiconductor layer is selectively etched, so that the island-shape semiconductor layer 124 is formed in which at least part thereof is in contact with the semiconductor layer 119 with high conductivity and the semiconductor layer 121 with high conductivity (see FIG. 5E). Embodiment 1 may be referred to for the detail of the island-shape semiconductor layer 124.

Besides, Embodiment 1 can be referred to for the detail of forming the island-shape semiconductor layer 124. Embodiment 1 can be referred to for the details of a variety of treatment on the island-shape semiconductor layer 124 as well.

Through the above steps, a transistor 170 in which the island-shape semiconductor layer 124 is used as a channel formation region can be formed. Further, in the region where the second wiring 122 is overlapped with the first wiring 109 (the region where the first wiring 109 and the second wiring 122 intersect with each other), a stacked-layer structure 172 of the first wiring 109, the gate insulating layer 114, the insulating layer 115, the second wiring 122, and the semiconductor layer 123 with high conductivity can be formed. Thus, the capacitance value of the parasitic capacitance can be reduced.

After that, a protective insulating layer (not shown) is formed so as to cover the transistor 170 and the stacked-layer structure 172. Embodiment 1 can be referred to for the details. Then, a variety of electrodes and a wiring are formed, whereby a semiconductor device provided with the transistor 170 is completed.

As described in this embodiment, an insulating layer other than a gate insulating layer is provided between the first wiring and the second wiring, whereby the capacitance value of the parasitic capacitance can be reduced without increasing the thickness of the gate insulating layer. In other words, the capacitance value of the parasitic capacitance can be reduced without deteriorating element characteristics. In addition, etching treatment of the insulating layer and the gate insulating layer is performed under the condition where the selectivity ratio can be obtained, so that a semiconductor device in which variations in element characteristics are suppressed can be provided.

Note that this embodiment can be implemented in combination with any of the other embodiments or example as appropriate.

Embodiment 4

Figure 8:
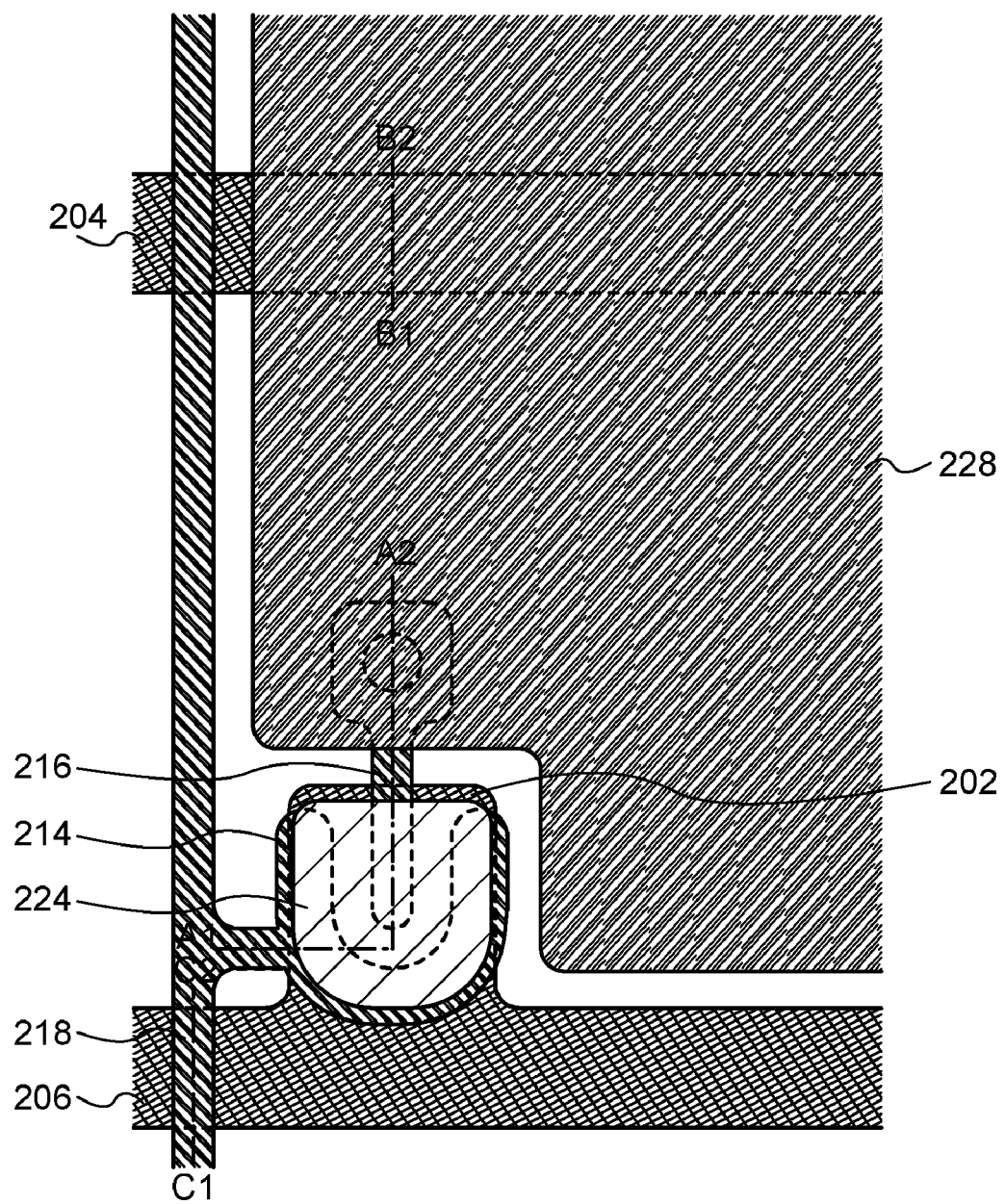
FIG. 8 is a plan view of a semiconductor device of Embodiment 4.

In this embodiment, a step of manufacturing of an active matrix substrate which is an example of a usage pattern of a semiconductor device is described with reference to drawings. Note that many parts of a manufacturing step described in this embodiment are the same as those in Embodiments 1 to 3. Therefore, hereinafter, description for the same parts as those of the above embodiments is omitted and different parts from the above embodiments are described in detail. Note that in the following description, FIGS. 6A to 6C and FIGS. 7A to 7C are cross-sectional views and FIG. 8 is a plan view. In addition, A1-A2, B1-B2, and C1-C2 in FIGS. 6A to 6C and FIGS. 7A to 7C are regions corresponding to A1-A2, B1-B2, and C1-C2 in FIG. 8, respectively.

First, a wiring and an electrode (a gate electrode 202, a capacitor wiring 204, a first wiring 206, and a first terminal 208) are formed over a substrate 200 having an insulating surface (see FIG. 6A). Note that the gate electrode 202 and the first wiring 206 are illustrated distinctively in the drawing for convenience in order to clarify an intersection portion of the wirings; however, it is needless to say that a structure may be used in which the gate electrode 202 and the first wiring 206 are integrated.

In this embodiment, the case where the method described in Embodiment 1, in other words, the case where the above wirings and electrode are formed using a multi-tone mask is described. Specifically, after the above wirings and electrode are formed, a resist mask is made to recede, so that a resist mask 210 is left over part of the first wiring 206 (see FIG. 6A). Embodiment 1 can be referred to for a method for forming the resist mask, a method for making the resist mask recede, and the like.

Note that the capacitor wiring 204 and the first terminal 208 can be formed at the same time using the same material and the same manufacturing method as the gate electrode 202. Embodiment 1 can be referred to for the details of the material and the manufacturing method of the gate electrode 202.

Next, a gate insulating layer 212 is formed over the gate electrode 202 and the gate insulating layer 212 is selectively etched so as to expose the first terminal 208, whereby a contact hole is formed (see FIG. 6B). There is no particular limitation on the etching treatment. Wet etching may be used, or dry etching may be used.

Next, after a conductive layer covering the gate insulating layer 212 and the first terminal 208 is formed, the conductive layer is selectively etched, so that a source electrode 214 (or a drain electrode), a drain electrode 216 (or a source electrode), a second wiring 218, a connection electrode 220, and a second terminal 222 are formed (see FIG. 6C). Note that the source electrode 214 and the second wiring 218 are illustrated distinctively in the drawing for convenience in order to clarify an intersection portion of the wirings; however, it is needless to say that a structure may be used in which the source electrode 214 and the second wiring 218 are integrated.

The detail of the conductive layer 102 in Embodiment 1 or the like can be referred to for the material and the manufacturing method of the above conductive layer. There is no particular limitation on etching treatment; however, in the case of using dry etching treatment, miniaturization of a wiring structure can be achieved as compared to the case of using wet etching treatment.

For example, the connection electrode 220 can be in directly contact with the first terminal 208 through a contact hole formed in the gate insulating layer 212. Further, the second terminal 222 can be electrically connected to the second wiring 218 (including the source electrode 214).

Next, after a semiconductor layer is formed so as to cover at least the source electrode 214 and the drain electrode 216, the semiconductor layer is selectively etched to form the island-shape semiconductor layer 224 (see FIG. 7A). Here, the island-shape semiconductor layer 224 is in contact with parts of the source electrode 214 and the drain electrode 216. Embodiment 1 can be referred to for the detail of the island-shape semiconductor layer 224 as well. Note that also in this embodiment, the case where the island-shape semiconductor layer 124 using an oxide semiconductor material is formed to have a single-layer structure is described.

Note that heat treatment at 100° C. to 800° C., typically 200° C. to 400° C., is preferably performed after the island-shape semiconductor layer 224 using an oxide semiconductor material is formed. For example, heat treatment can be performed at 350° C. for an hour in a nitrogen atmosphere. There is no particular limitation on the timing of the heat treatment as long as it is after the island-shape semiconductor layer 224 (or the semiconductor layer before the etching) is formed. Embodiment 1 or the like can be referred to for the detail of the other treatment.

Through the above steps, a transistor 250 is completed.

Next, a protective insulating layer 226 covering the transistor 250 is formed and the protective insulating layer 226 is selectively etched to form a contact hole reaching the drain electrode 216, the connection electrode 220, and the second terminal 222 (see FIG. 7B).

Next, transparent conductive layers 228, 230, and 232 which are electrically connected to the drain electrode 216, the connection electrode 220, and the second terminal 222, respectively, are formed (see FIG. 7C and FIG. 8).

The transparent conductive layer 228 functions as a pixel electrode and the transparent conductive layers 230 and 232 function as an electrode or a wiring used for connection with a flexible printed circuit (an FPC). More specifically, the transparent conductive layer 230 formed over the connection electrode 220 can be used as a terminal electrode for connection which functions as an input terminal for the gate wiring (the first wiring 206 in this embodiment) and the transparent conductive layer 232 formed over the second terminal 222 can be used as a terminal electrode for connection which functions as an input terminal for the source wiring (the second wiring 218 in this embodiment).

In addition, storage capacitance can be formed by the capacitor wiring 204, the gate insulating layer 212, and the transparent conductive layer 228.

The transparent conductive layers 228, 230, and 232 can be formed using a material such as indium oxide ($In_2O_3$), indium oxide tin oxide alloy ($In_2O_3$—$SaO_2$, abbreviated as ITO), or indium oxide zinc oxide alloy ($In_2O_3$—$ZnO$). For example, after the films containing the above material are formed by a sputtering method, a vacuum evaporation method, or the like, an unnecessary portion is removed by etching, whereby the transparent conductive layers 228, 230, and 232 may be formed.

Through the above steps, an active matrix substrate including a bottom-gate transistor and an element such as storage capacitance can be completed. For example, in the case of manufacturing an active matrix liquid crystal display device by using this, a liquid crystal layer may be provided between an active matrix substrate and a counter substrate provided with a counter electrode, and the active matrix substrate and the counter substrate may be fixed to each other.

As described in this embodiment, part of the resist mask formed using a multi-tone mask is provided between the first wiring and the second wiring, whereby the capacitance value of the parasitic capacitance can be reduced while suppressing increase in the number of manufacturing steps.

In this embodiment, the method for manufacturing an active matrix substrate is described in accordance with the method described in Embodiment 1; however, the present invention disclosed is not limited thereto. An active matrix substrate may be manufactured by the method described in Embodiment 2 or 3. Note that this embodiment can be implemented in combination with any of the other embodiments or example as appropriate.

Embodiment 5

Figure 9A:
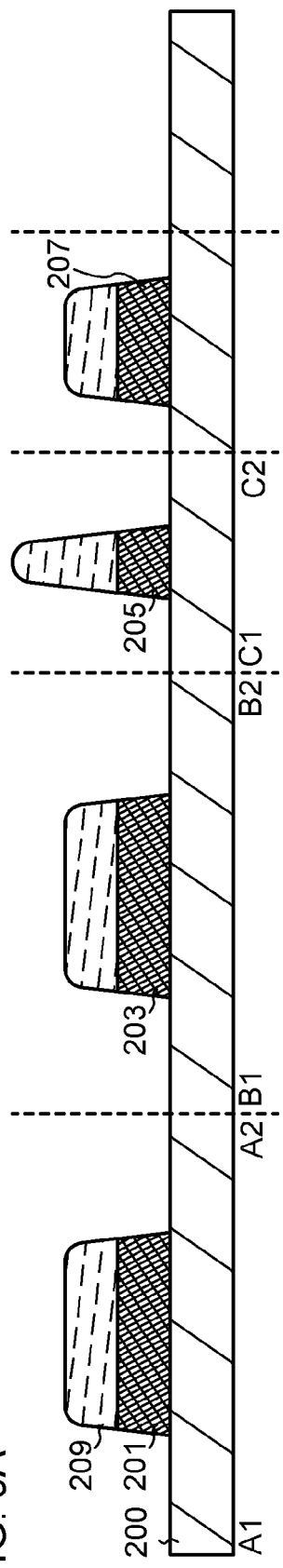
FIGS. 9A to 9C are cross-sectional views illustrating a method for manufacturing a semiconductor device of Embodiment 5.
Figure 9B:
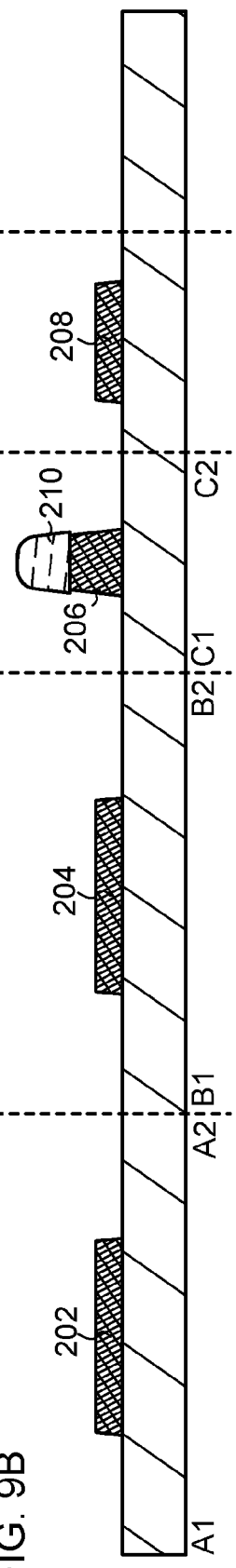
Figure 9C:
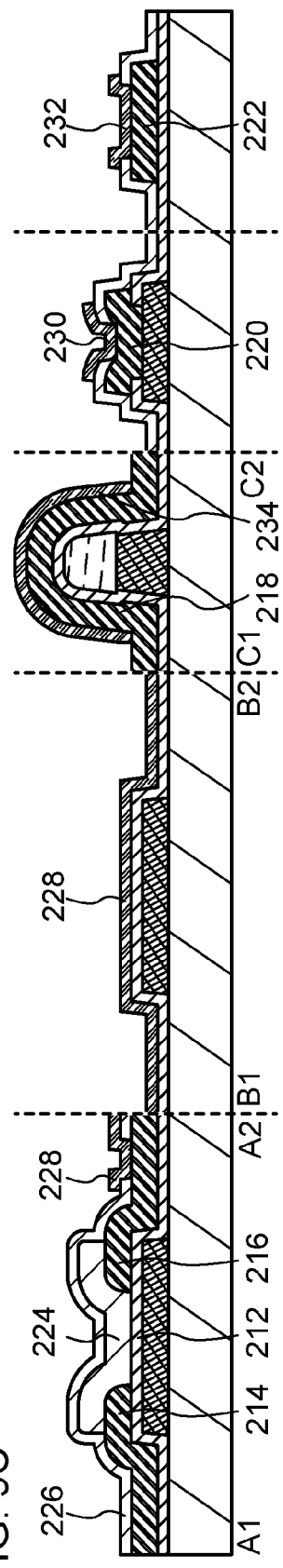
Figure 10:
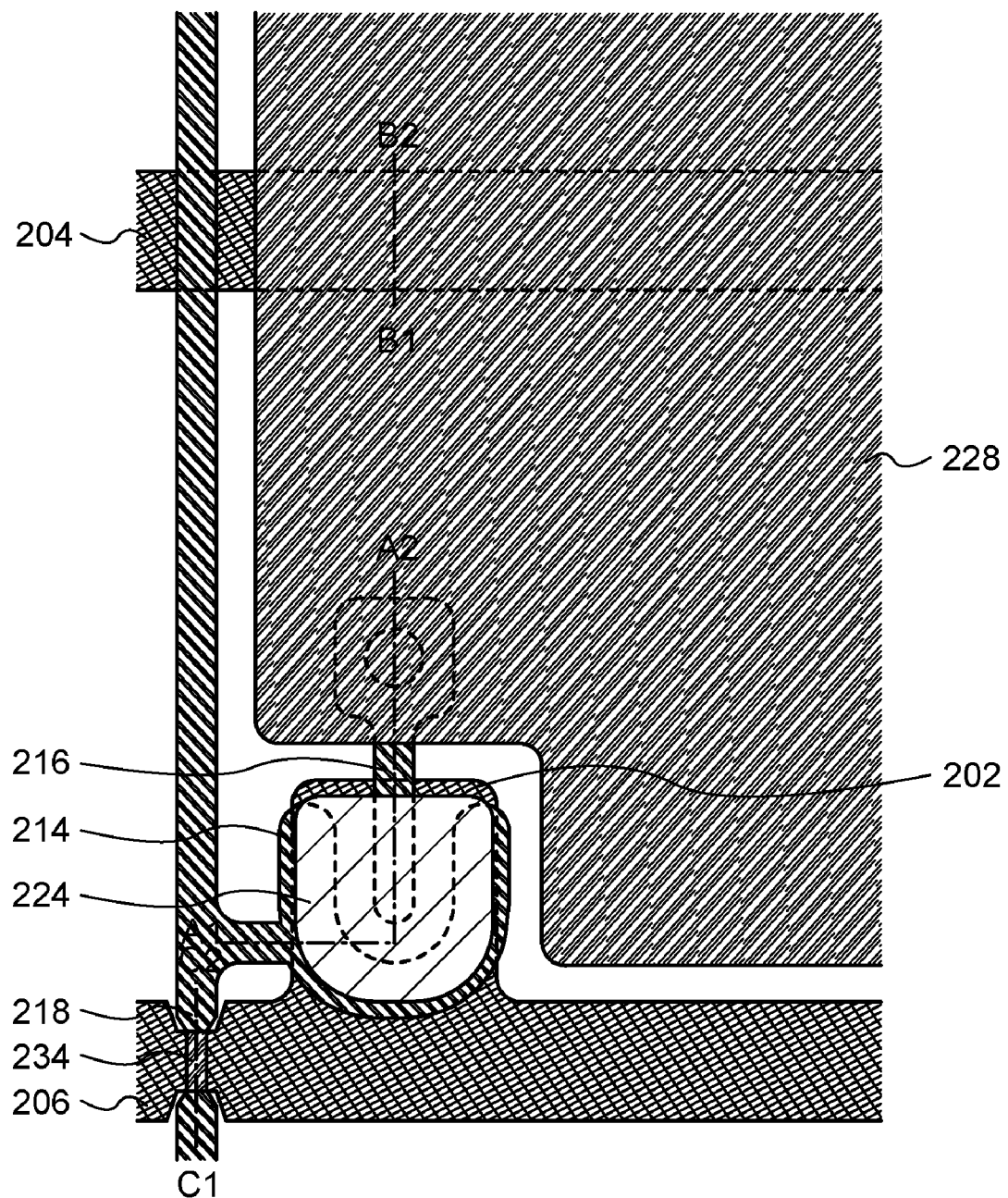
FIG. 10 is a plan view of a semiconductor device of Embodiment 5.

In this embodiment, another example of a step of manufacturing of an active matrix substrate is described with reference to drawings. Note that many parts of a method for manufacturing a semiconductor device in this embodiment are the same as those in Embodiments 1 to 4. Therefore, hereinafter, description for the same parts as those of the above embodiments is omitted and different parts from the above embodiments are described in detail. Note that in the following description, FIGS. 9A to 9C are cross-sectional views and FIG. 10 is a plan view. In addition, A1-A2, B1-B2, and C1-C2 in FIGS. 9A to 9C are regions corresponding to A1-A2, B1-B2, and C1-C2 in FIG. 10, respectively.

First, a conductive layer is formed over the substrate 200 having an insulating surface and a resist mask 209 is formed over the conductive layer using a multi-tone mask. The conductive layer is etched using the resist mask 209 to form conductive layers 201, 203, 205, and 207 (see FIG. 9A).

Embodiments 1 to 4 can be referred to for the details of the conductive layers and the resist mask. Note that in the above etching, the conductive layers 201, 203, and 207 are formed thicker than an electrode or the like which is finally formed. In addition, the width of the conductive layer 205 in C1-C2 is smaller than the width thereof in the other regions.

Next, after the resist mask 209 is made to recede to expose surfaces of the conductive layers 201, 203, and 207, the gate electrode 202, the capacitor wiring 204, the first wiring 206, and the first terminal 208 are formed by thinning treatment (see FIG. 9B). At a stage in which the resist mask 209 is made to recede, the resist mask 210 is partly left above part of the conductive layer 205. Thus, only the region where the resist mask 210 is not left is thinned.

As the thinning treatment, a variety of etching treatment can be used. Note that the width of the first wiring 206 is slightly smaller than the width of the conductive layer 205 due to the etching treatment.

After that, the gate insulating layer 212, the source electrode 214, the drain electrode 216, the second wiring 218, the connection electrode 220, the second terminal 222, the island-shape semiconductor layer 224, the protective insulating layer 226, the transparent conductive layers 228, 230, 232, and 234, and the like are formed, whereby an active matrix substrate is completed (see FIG. 9C and FIG. 10). Embodiment 4 or the like may be referred to for steps after the step of forming the gate insulating layer 212. Note that in this embodiment, when the transparent conductive layer 228 and the like are formed, the transparent conductive layer 234 is also formed in a region overlapping with the first wiring 206 over the second wiring 218.

In this embodiment, the widths of the first wiring 206 and the second wiring 218 are reduced in a region where the first wiring 206 and the second wiring 218 intersect with each other. Thus, the capacitance value of the parasitic capacitance formed in an intersection region of the wirings can be further reduced. In the region where the first wiring 206 and the second wiring 218 intersect with each other, the first wiring 206 is formed thick, and the transparent conductive layer 234 is provided over the second wiring 218. Thus, the increase in wiring resistance due to the decrease in the wiring width can be prevented and the decrease in performance of a semiconductor device can be suppressed.

Note that in this embodiment, a structure where the width and the thickness of the wiring in the region where the first wiring 206 and the second wiring 218 intersect with each other are different from those of wirings in the other regions is employed; however, the present invention disclosed is not limited thereto. Also in an intersection region of the capacitor wiring 204 and the second wiring 218, a structure similar to the above structure can be employed. In this case, the capacitance value of the parasitic capacitance which occurs in the intersection region of the capacitor wiring 204 and the second wiring 218 can also be reduced.

This embodiment can be implemented in combination with any of the other embodiments or example as appropriate.

Embodiment 6

In this embodiment, the case where a thin film transistor is manufactured and a semiconductor device having a display function (also referred to as a display device) is manufactured using the thin film transistor in a pixel portion and in a driver circuit is described. Further, part or whole of a driver circuit can be formed over the same substrate as a pixel portion, whereby a system-on-panel can be obtained.

The display device includes a display element. As the display element, a liquid crystal element (also referred to as a liquid crystal display element), a light-emitting element (also referred to as a light-emitting display element), or the like can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as electronic ink, may be used.

Further, the display device includes a panel in which the display element is sealed, and a module in which an IC or the like including a controller is mounted on the panel. Furthermore, an element substrate which forms a display device is provided with means for supplying current to the display element in each of pixel portions. Specifically, the element substrate may be in a state after only a pixel electrode of the display element is formed, or a state after a conductive film to be a pixel electrode is formed and before the conductive film is etched.

Note that a display device in this specification means an image display device, a display device, a light source (including a lighting device), and the like. Further, the display device also includes the following modules in its category: a module to which a connector such as an FPC (flexible printed circuit), a TAB (tape automated bonding) tape, or a TCP (tape carrier package) is attached; a module having a TAB tape or a TCP at the tip of which a printed wiring board is provided; a module in which an IC (integrated circuit) is directly mounted on a display element by a COG (chip on glass) method, and the like.

Hereinafter, in this embodiment, an example of a liquid crystal display device is described. FIGS. 11A-1, 11A-2, and 11B are plan views and a cross-sectional view of a panel in which thin film transistors 4010 and 4011 and a liquid crystal element 4013 which are formed over a first substrate 4001 are sealed by a second substrate 4006 and a sealant 4005. Here, FIGS. 11A-1 and 11A-2 are each a plan view and FIG. 11B is a cross-sectional view taken along the line M-N of FIGS. 11A-1 and 11A-2.

The sealant 4005 is provided to surround a pixel portion 4002 and a scanning line driver circuit 4004 that are provided over the first substrate 4001. The second substrate 4006 is provided over the pixel portion 4002 and the scanning line driver circuit 4004. In other words, the pixel portion 4002 and the scanning line driver circuit 4004 are sealed together with a liquid crystal layer 4008, by the first substrate 4001, the sealant 4005, and the second substrate 4006. Further, a signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used as appropriate. FIGS. 11A-1 illustrates an example of mounting the signal line driver circuit 4003 by a COG method, and FIG. 11A2 illustrates an example of mounting the signal line driver circuit 4003 by a TAB method.

In addition, the pixel portion 4002 and the scanning line driver circuit 4004 provided over the first substrate 4001 each include a plurality of thin film transistors. FIG. 11B illustrates the thin film transistor 4010 included in the pixel portion 4002 and the thin film transistor 4011 included in the scanning line driver circuit 4004. Insulating layers 4020 and 4021 are provided over the thin film transistors 4010 and 4011.

As the thin film transistors 4010 and 4011, the thin film transistors which are described in Embodiments 1 to 5 or the like can be employed. Note that in this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. The liquid crystal element 4013 is formed by the pixel electrode layer 4030, the counter electrode layer 4031, and the liquid crystal layer 4008. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that as the first substrate 4001 and the second substrate 4006, glass, metal (typically, stainless steel), ceramic, plastic, or the like can be used. As plastic, an FRP (fiberglass-reinforced plastics) substrate, a PVF (polyvinyl fluoride) film, a polyester film, an acrylic resin film, or the like can be used. Alternatively, a sheet with a structure in which an aluminum foil is sandwiched between PVF films or polyester films can be used.

A columnar spacer 4035 is provided in order to control the distance (a cell gap) between the pixel electrode layer 4030 and the counter electrode layer 4031. The columnar spacer 4035 can be obtained by selective etching of an insulating film. Note that a spherical spacer may be used instead of a columnar spacer. Further, the counter electrode layer 4031 is electrically connected to a common potential line provided over the same substrate as the thin film transistor 4010. For example, the counter electrode layer 4031 can be electrically connected to the common potential line through conductive particles provided between the pair of substrates. Note that the conductive particles are preferably contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is preferably used. Thus, the temperature range can be improved. The liquid crystal composition which includes a liquid crystal showing a blue phase and a chiral agent has a small response time of 10 μas to 100 μas, has optical isotropy, which makes the alignment process unneeded, and has a small viewing angle dependence.

Although an example of a transmissive liquid crystal display device is described in this embodiment, the present invention is not limited thereto. An embodiment of the present invention may also be applied to a reflective liquid crystal display device or a semi-transmissive liquid crystal display device.

In this embodiment, an example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked-layer structure of the polarizing plate and the coloring layer is not limited to that described in this embodiment and may be set as appropriate depending on materials of the polarizing plate and the coloring layer or conditions of manufacturing steps. Furthermore, a light-blocking film serving as a black matrix may be provided.

In this embodiment, in order to reduce the surface roughness of the thin film transistor, the thin film transistor obtained in Embodiments 1 to 5 is covered with the insulating layer 4021. Note that the insulating layer 4020 corresponds to the protective insulating layer in Embodiments 1 to 5.

As the insulating layer 4021, an organic material having heat resistance such as polyimide, acrylic, benzocyclobutene, polyamide, or epoxy can be used. In addition to such organic materials, a low-dielectric constant material (a low-k material), a siloxane-based resin, PSG (phosphosilicate glass), BPSG (borophosphosilicate glass), or the like can be used. Note that the insulating layer 4021 may be formed by stacking a plurality of insulating films formed of these materials.

Note that a siloxane-based resin is a resin formed from a siloxane-based material as a starting material and having the bond of Si—O—Si. As a substituent, an organic group (e.g., an alkyl group or an aryl group) or a fluoro group may be used. The organic group may include a fluoro group.

There is no particular limitation on the method for forming the insulating layer 4021, and the insulating layer 4021 can be formed, depending on the material, by a sputtering method, an SOG method, a spin coating method, a dipping method, a spray coating method, a droplet discharge method (an inkjet method, screen printing, offset printing, or the like), a doctor knife, a roll coater, a curtain coater, a knife coater, or the like.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) may be used for the pixel electrode layer 4030 and the counter electrode layer 4031. The pixel electrode made of the conductive composition preferably has a sheet resistance of $1.0 \times 10^4$ Ω/sq. or less and a transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive high molecule can be used. For example, polyaniline or a derivative thereof, polypyrrole or a derivative thereof, polythiophene or a derivative thereof, or a copolymer of two or more kinds of them can be given.

A variety of signals are supplied to the signal line driver circuit 4003, the scanning line driver circuit 4004, the pixel portion 4002, or the like from an FPC 4018.

In addition, a connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 11A-1, 11A-2 and 11B illustrate an example in which the signal line driver circuit 4003 is formed separately and mounted on the first substrate 4001; however, the present invention disclosed is not limited to this structure. The scanning line driver circuit may be separately formed and then mounted, or only part of the signal line driver circuit or part of the scanning line driver circuit may be separately formed and then mounted.

Figure 12:
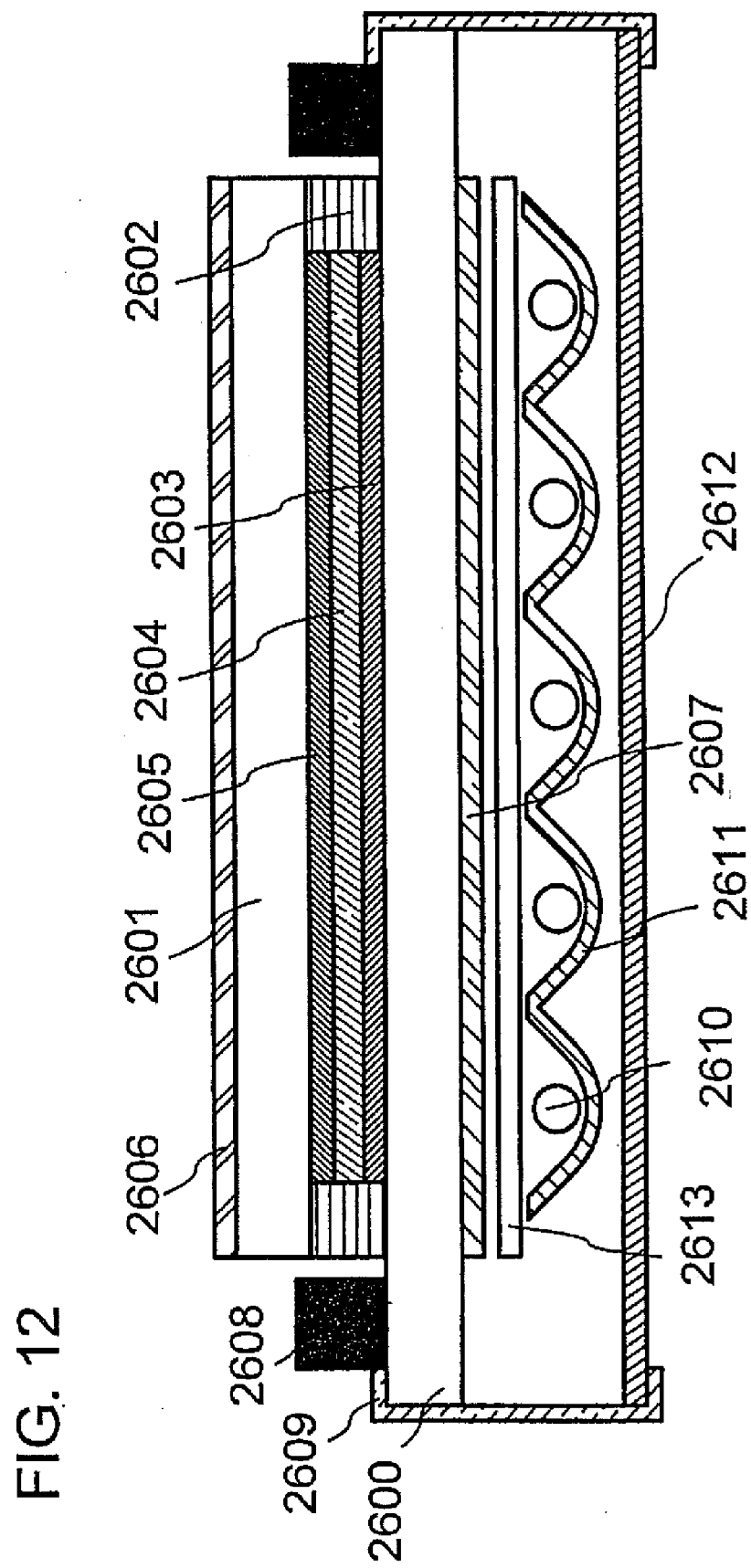
FIG. 12 is a view illustrating a semiconductor device of Embodiment 6.

FIG. 12 illustrates an example where a liquid crystal display module which corresponds to one embodiment of a semiconductor device is formed using a TFT substrate 2600.

In FIG. 12, the TFT substrate 2600 and a counter substrate 2601 are bonded to each other by a sealant 2602 and an element layer 2603 including a TFT and the like, a liquid crystal layer 2604 including an alignment film and a liquid crystal layer, a coloring layer 2605, a polarizing plate 2606, and the like are provided between the TFT substrate 2600 and the counter substrate 2601, whereby a display region is formed. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609. Thus, an external circuit such as a control circuit or a power source circuit is included in a liquid crystal module. A retardation plate may be provided between the polarizing plate and the liquid crystal layer.

For a driving method of a liquid crystal, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above steps, a high-performance liquid crystal display device can be manufactured. Note that this embodiment can be implemented in combination with any of the other embodiments or example as appropriate.

Embodiment 7

In this embodiment, active matrix electronic paper which is an example of a semiconductor device is described with reference to FIG. 13. A thin film transistor 650 used for the semiconductor device can be manufactured in a manner similar to that of the thin film transistor described in Embodiments 1 to 5.

Figure 13:
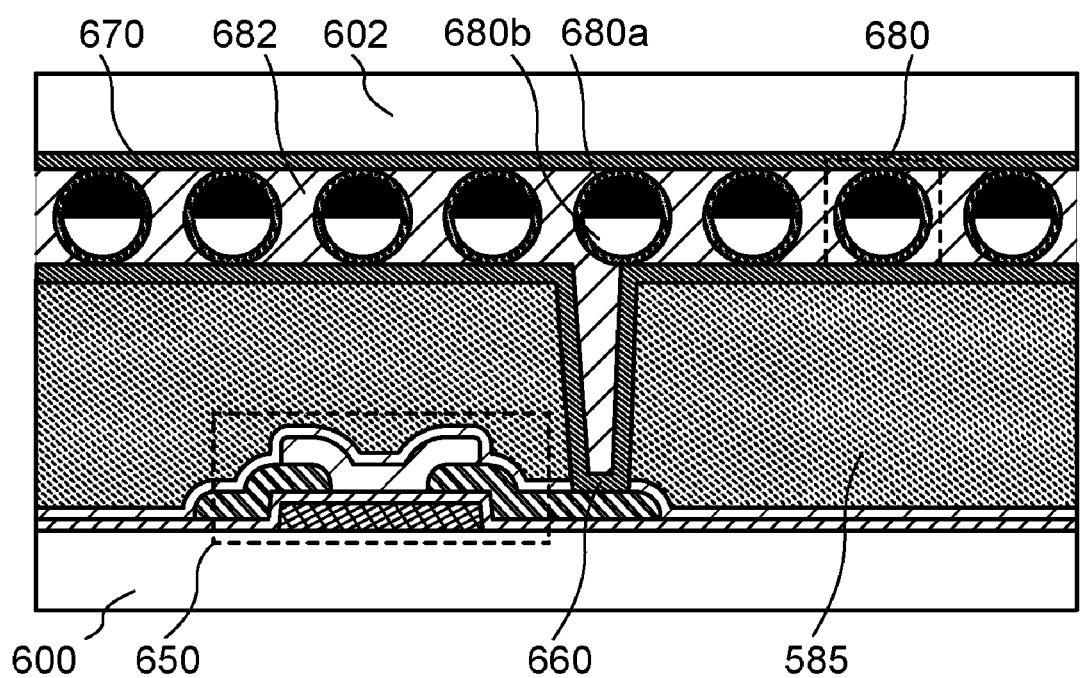
FIG. 13 is a view illustrating a semiconductor device of Embodiment 7.

The electronic paper in FIG. 13 is an example of a display device using a twisting ball display system. The twisting ball display system refers to a method in which spherical particles each colored in black or white are arranged between a first electrode layer and a second electrode layer, and a potential difference is generated between the first electrode layer and the second electrode layer, whereby orientation of the spherical particles is controlled, so that display is performed.

The thin film transistor 650 provided over the substrate 600 is a thin film transistor of the present invention disclosed and has a structure in which an oxide semiconductor layer is sandwiched between the source or drain electrode layer which is above the oxide semiconductor layer and the source or drain electrode layers which is below the oxide semiconductor layer. Note that the source or drain electrode layer is electrically connected to a first electrode layer 660 through a contact hole formed in a protective insulating layer. A substrate 602 is provided with a second electrode layer 670. Between the first electrode layer 660 and the second electrode layer 670, spherical particles 680 each having a black region 680a and a white region 680b are provided. A space around the spherical particles 680 is filled with a filler 682 such as a resin (see FIG. 13). In Embodiment 13, the first electrode layer 660 corresponds to a pixel electrode, and the second electrode layer 670 corresponds to a common electrode. The second electrode layer 670 is electrically connected to a common potential line provided over the same substrate as the thin film transistor 650.

Instead of the twisting ball, an electrophoretic display element can also be used. In that case, for example, a microcapsule having a diameter of approximately 10 μm to 200 μm in which transparent liquid, positively-charged white microparticles, and negatively-charged black microparticles are encapsulated, is used. When an electric field is applied between the first electrode layer and the second electrode layer, the white microparticles and the black microparticles move to opposite sides from each other, so that white or black is displayed. The electrophoretic display element has higher reflectance than a liquid crystal display element, and thus, an auxiliary light is unnecessary and a display portion can be recognized in a place where brightness is not sufficient. In addition, there is an advantage that even when power is not supplied to the display portion, an image which has been displayed once can be maintained.

Through the above steps, high-performance electronic paper can be manufactured using the present invention disclosed. Note that this embodiment can be implemented in combination with any of the other embodiments or example as appropriate.

Embodiment 8

In this embodiment, an example of a light-emitting display device is described as a semiconductor device. As a display element included in a display device, a light-emitting element utilizing electroluminescence is described here. Light-emitting elements utilizing electroluminescence are classified by whether a light-emitting material is an organic compound or an inorganic compound. In general, the former is called an organic EL element, and the latter is called an inorganic EL element.

In an organic EL element, by application of a voltage to a light-emitting element, electrons and holes are separately injected from a pair of electrodes into a layer containing a light-emitting organic compound, and current flows. Then, the carriers (electrons and holes) recombine, thereby emitting light. Owing to such a mechanism, the light-emitting element is called a current-excitation light-emitting element.

The inorganic EL elements are classified into a dispersion-type inorganic EL element and a thin-film-type inorganic EL element depending on their element structures. A dispersion-type inorganic EL element has a light-emitting layer where particles of a light-emitting material are dispersed in a binder, and its light emission mechanism is donor-acceptor recombination-type light emission which utilizes a donor level and an acceptor level. A thin-film-type inorganic EL element has a structure where a light-emitting layer is sandwiched between dielectric layers, which are further sandwiched between electrodes, and its light emission mechanism is localized-type light emission that utilizes inner-shell electron transition of metal ions. Note that, here, description is made using an organic EL element as a light-emitting element.

Structures of the light-emitting element are described with reference to FIGS. 14A to 14C. Here, a cross-sectional structure of a pixel is described by taking an n-channel driving TFT as an example. TFTs 701, 711, and 721 used for semiconductor devices illustrated in FIGS. 14A to 14C can be manufactured in a manner similar to that of the thin film transistors described in Embodiments 1 to 5.

In order to extract light from a light-emitting element, at least one of the anode and the cathode is transparent. Here, transparent means that at least an emission wavelength has sufficiently high transmittance. As a method for extracting light, a thin film transistor and a light emitting element are formed over a substrate; and there are a top emission method (a top extraction method) by which light is extracted from a side opposite to the substrate, a bottom emission method (a bottom extraction method) by which light is extracted from the substrate side, a dual emission method (a dual extraction method) by which light is extracted from both the substrate side and the side opposite to the substrate, and the like.

A light-emitting element having a top emission method is described with reference to FIG. 14A.

Figure 14A:
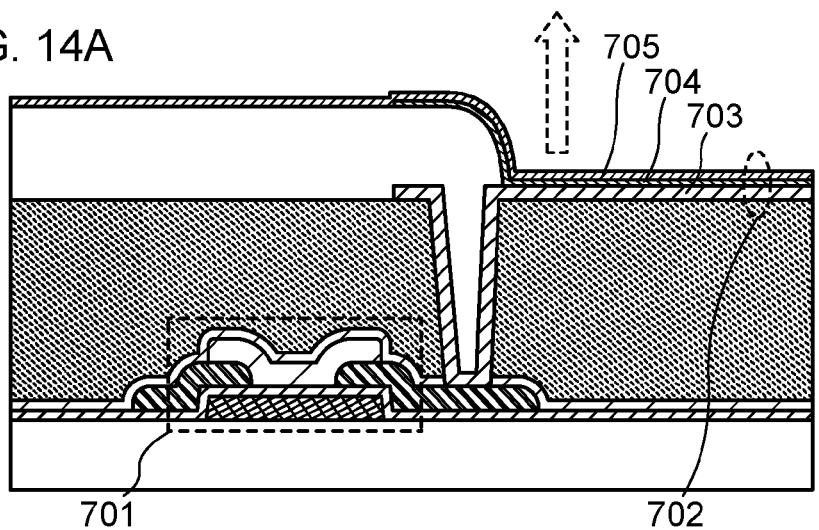
FIGS. 14A to 14C are views illustrating a semiconductor device of Embodiment 8.

FIG. 14A is a cross-sectional view of a pixel in the case where light is emitted from a light-emitting element 702 to an anode 705 side. Here, a cathode 703 of the light-emitting element 702 and the TFT 701 which is a driving TFT are electrically connected to each other, and a light-emitting layer 704 and the anode 705 are stacked in this order over the cathode 703. As the cathode 703, a conductive film which has a low work function and reflects light can be used. For example, a material such as Ca, Al, CaF, MgAg, or AlLi is preferably used to form the cathode 703. The light-emitting layer 704 may be formed using either a single layer or a plurality of layers stacked. When the light-emitting layer 704 is formed using a plurality of layers, an electron-injecting layer, an electron-transporting layer, a light-emitting layer, a hole-transporting layer, and a hole-injecting layer are preferably stacked in this order over the cathode 703; however, needless to say, it is not necessary to form all of these layers. The anode 705 is formed using a light-transmitting conductive material. For example, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added may be used.

A structure in which the light-emitting layer 704 is sandwiched between the cathode 703 and the anode 705 can be called the light-emitting element 702. In the case of the pixel illustrated in FIG. 14A, light is emitted from the light-emitting element 702 to the anode 705 side as indicated by an arrow.

Next, a light-emitting element having a bottom emission method is described with reference to FIG. 14B.

Figure 14B:
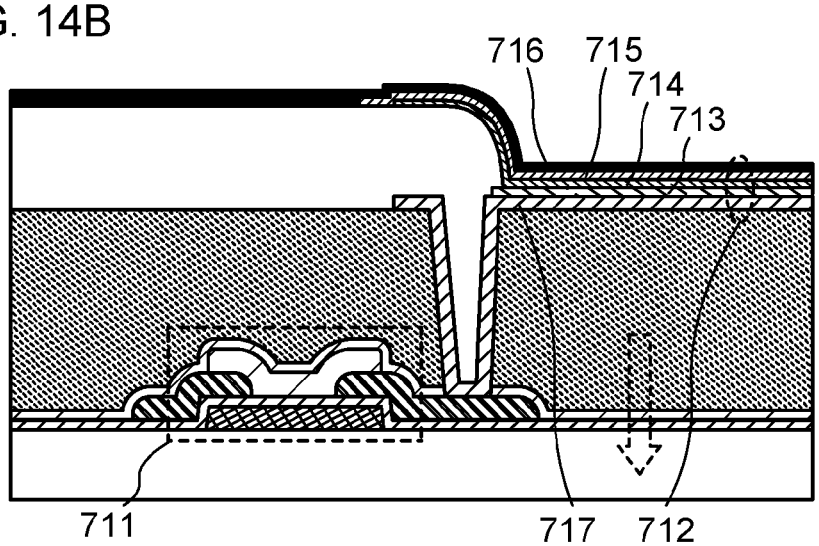

FIG. 14B is a cross-sectional view of a pixel in the case where light is emitted from a light-emitting element 712 to a cathode 713 side. Here, the cathode 713 of the light-emitting element 712 is formed over a light-transmitting conductive film 717 which is electrically connected to the driving TFT 711, and a light-emitting layer 714 and an anode 715 are stacked in this order over the cathode 713. Note that a light-blocking film 716 may be formed so as to cover the anode 715 when the anode 715 has a light-transmitting property. For the cathode 713, a conductive material having a low work function can be used like in the case of FIG. 14A. Note that the cathode 713 is formed to a thickness that can transmit light (preferably, approximately 5 nm to 30 nm). For example, an aluminum film with a thickness of approximately 20 nm can be used as the cathode 713. Similarly to the case of FIG. 14A, the light-emitting layer 714 may be formed using either a single layer or a plurality of layers stacked. Similarly to the case of FIG. 14A, the anode 715 is not required to transmit light, but may be made of a light-transmitting conductive material. As the light-blocking film 716, a metal which reflects light or the like can be used; however, it is not limited thereto. For example, a resin to which black pigments is added or the like can also be used.

A structure in which the light-emitting layer 714 is sandwiched between the cathode 713 and the anode 715 can be called the light-emitting element 712. In the case of the pixel illustrated in FIG. 14B, light is emitted from the light-emitting element 712 to the cathode 713 side as indicated by an arrow.

Next, a light-emitting element having a dual emission method is described with reference to FIG. 14C.

Figure 14C:
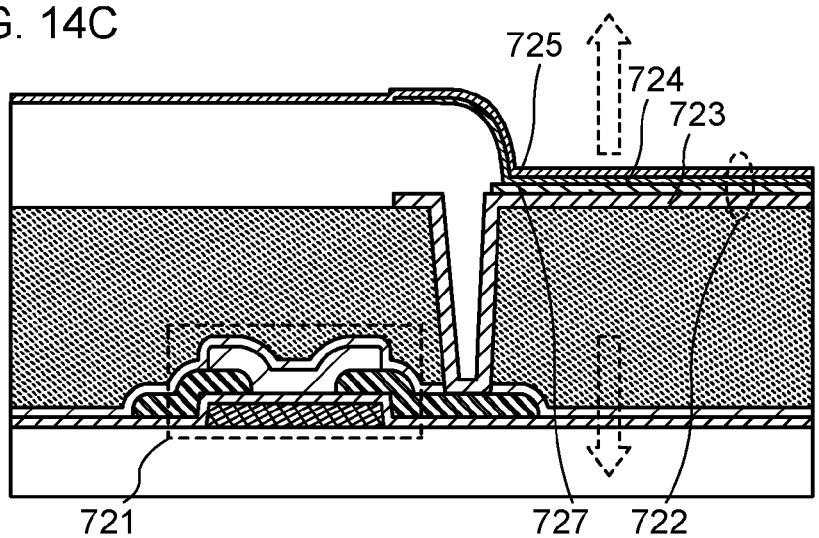

In FIG. 14C, a cathode 723 of a light-emitting element 722 is formed over a light-transmitting conductive film 727 which is electrically connected to the driving TFT 721, and a light-emitting layer 724 and an anode 725 are stacked in this order over the cathode 723. For the cathode 723, a conductive material having a low work function can be used like in the case of FIG. 14A. Note that the cathode 723 is formed to a thickness that can transmit light. For example, an Al film with a thickness of approximately 20 nm can be used as the cathode 723. Similarly to the case of FIG. 14A, the light-emitting layer 724 may be formed using either a single layer or a plurality of layers stacked. Similarly to the case of FIG. 14A, the anode 725 can be formed using a light-transmitting conductive material.

A structure where the cathode 723, the light-emitting layer 724, and the anode 725 overlap with one another can be called the light-emitting element 722. In the case of the pixel illustrated in FIG. 14C, light is emitted from the light-emitting element 722 to both the anode 725 side and the cathode 723 side as indicated by arrows.

Although an organic EL element is described here as a light-emitting element, an inorganic EL element can also be provided as a light-emitting element. The example is described here in which a thin film transistor (a driving TFT) which controls the driving of a light-emitting element is electrically connected to the light-emitting element; however, a structure may be employed in which a TFT for current control is connected between the driving TFT and the light-emitting element.

Note that the structure of the semiconductor device described in this embodiment is not limited to those illustrated in FIGS. 14A to 14C and can be modified in various ways.

Next, the appearance and a cross section of a light-emitting display panel (also referred to as a light-emitting panel), which corresponds to one embodiment of the semiconductor device, are described with reference to FIGS. 15A and 15B. FIGS. 15A and 15B are a plan view and a cross-sectional view of a panel in which thin film transistors 4509 and 4510 and a light-emitting element 4511 which are formed over a first substrate 4501 are sealed by a second substrate 4506 and a sealant 4505. FIG. 15A is a plan view and FIG. 15B is a cross-sectional view taken along the line H-I of FIG. 15A.

A sealant 4505 is provided to surround a pixel portion 4502, signal line driver circuits 4503a and 4503b, and scanning line driver circuits 4504a and 4504b, which are provided over a first substrate 4501. In addition, a second substrate 4506 is provided over the pixel portion 4502, the signal line driver circuits 4503a and 4503b, and the scanning line driver circuits 4504a and 4504b. In other words, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506. It is preferable that a display device be thus packaged (sealed) using a protective film (such as a bonding film or an ultraviolet curable resin film), a cover material, or the like with high air-tightness and little degasification.

The pixel portion 4502, the signal line driver circuits 4503a and 4503b, and the scanning line driver circuits 4504a and 4504b, which are formed over the first substrate 4501, each include a plurality of thin film transistors, and a thin film transistor 4510 included in the pixel portion 4502 and a thin film transistor 4509 included in the signal line driver circuit 4503a are illustrated as an example in FIG. 15B.

As the thin film transistors 4509 and 4510, the thin film transistors described in Embodiments 1 to 5 can be employed. Note that in this embodiment, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. In the structure of the light-emitting element 4511, the first electrode layer 4517, an electroluminescent layer 4512, and a second electrode layer 4513 are stacked; however, it is not limited to the structure described in this embodiment. The structure of the light-emitting element 4511 can be changed as appropriate depending on the direction in which light is extracted from the light-emitting element 4511, or the like.

A partition 4520 is formed using an organic resin film, an inorganic insulating film, organic polysiloxane, or the like. It is particularly preferable that the partition 4520 be formed of a photosensitive material to have an opening over the first electrode layer 4517 so that a sidewall of the opening is formed as an inclined surface with continuous curvature.

The electroluminescent layer 4512 may be formed using either a single layer or a plurality of layers stacked.

A protective film may be formed over the second electrode layer 4513 and the partition 4520 in order to prevent oxygen, hydrogen, moisture, carbon dioxide, or the like from entering into the light-emitting element 4511. As the protective film, a silicon nitride film, a silicon nitride oxide film, a DLC film, or the like can be formed.

A variety of signals are supplied to the signal line driver circuits 4503a and 4503b, the scanning line driver circuits 4504a and 4504b, the pixel portion 4502, or the like from FPCs 4518a and 4518b.

In this embodiment, an example is described where a connection terminal electrode 4515 is formed from the same conductive film as the first electrode layer 4517 of the light-emitting element 4511, and a terminal electrode 4516 is formed from the same conductive film as the source and drain electrode layers of the thin film transistors 4509 and 4510.

The connection terminal electrode 4515 is electrically connected to a terminal of the FPC 4518a through an anisotropic conductive film 4519.

The substrate located in the direction in which light is extracted from the light-emitting element 4511 needs to have a light-transmitting property. As a substrate having a light-transmitting property, a glass plate, a plastic plate, a polyester film, an acrylic film, and the like are given.

As the filler 4507, an ultraviolet curable resin, a thermosetting resin, or the like can be used, in addition to an inert gas such as nitrogen or argon. For example, polyvinyl chloride (PVC), acrylic, polyimide, an epoxy resin, a silicone resin, polyvinyl butyral (PVB), ethylene vinyl acetate (EVA), or the like can be used. In this embodiment, an example where nitrogen is used for the filler is described.

If needed, an optical film, such as a polarizing plate, a circularly polarizing plate (including an elliptically polarizing plate), a retardation plate (a quarter-wave plate or a half-wave plate), or a color filter, may be provided on a light-emitting surface of the light-emitting element. Furthermore, an antireflection treatment may be performed on a surface thereof. For example, anti-glare treatment by which reflected light can be diffused by projections and depressions on the surface so as to reduce the glare can be performed.

The signal line driver circuits 4503a and 4503b and the scanning line driver circuits 4504a and 4504b may be formed using a single crystal semiconductor film or a polycrystalline semiconductor film over a substrate separately prepared. Alternatively, only the signal line driver circuits or part thereof, or only the scanning line driver circuits or part thereof may be separately formed and mounted. This embodiment is not limited to the structure illustrated in FIGS. 15A and 15B.

Through the above steps, a high-performance light-emitting display device (display panel) can be manufactured. Note that this embodiment can be implemented in combination with any of the other embodiments or example as appropriate.

Embodiment 9

A semiconductor device can be applied to electronic paper. Electronic paper can be used for electronic appliances of a variety of fields as long as they can display data. For example, electronic paper can be applied to an e-book reader (electronic book), a poster, an advertisement in a vehicle such as a train, displays of various cards such as a credit card, or the like. Examples of the electronic appliances are illustrated in FIGS. 16A and 16B and FIG. 17.

Figure 16A:
FIGS. 16A and 16B are views illustrating examples of usage patterns of electronic paper.

FIG. 16A illustrates a poster 2631 using electronic paper. In the case where an advertising medium is printed paper, the advertisement is replaced by hands; however, by using electronic paper to which an embodiment of the present invention is applied, the advertising display can be changed in a short time. Furthermore, stable images can be obtained without display defects. Note that the poster may have a configuration capable of wirelessly transmitting and receiving data.

Figure 16B:
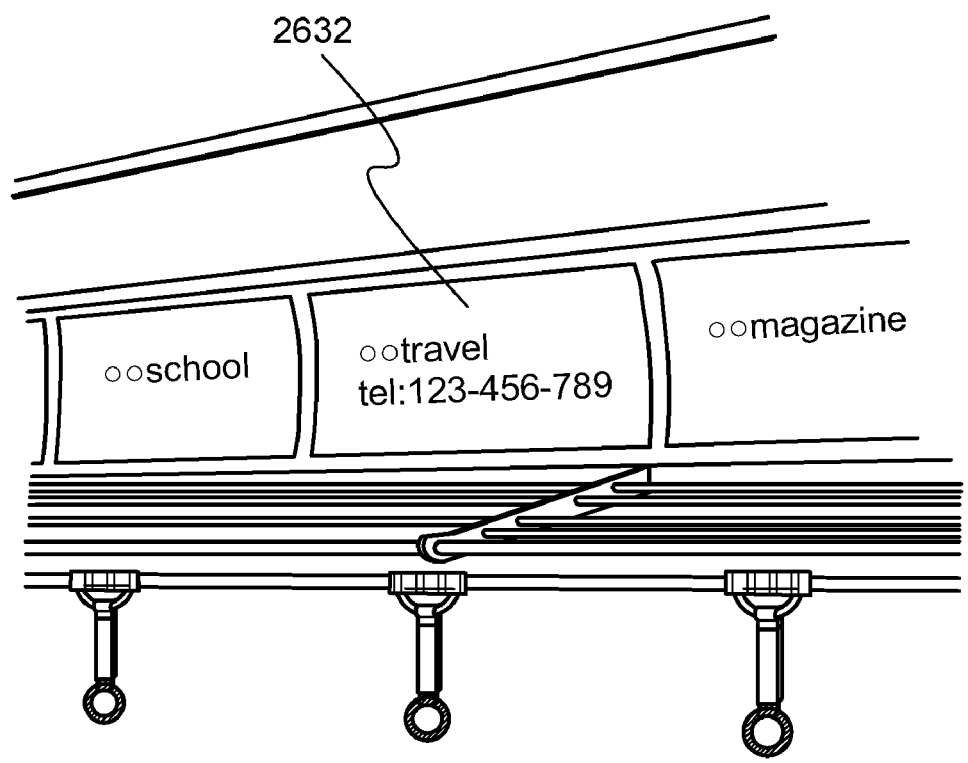

FIG. 16B illustrates an advertisement 2632 in a vehicle such as a train. In the case where an advertising medium is printed paper, the advertisement is replaced by hands; however, by using electronic paper to which an embodiment of the present invention is applied, the advertising display can be changed in a short time with less manpower. Furthermore, stable images can be obtained without display defects. Note that the advertisement in a vehicle may have a configuration capable of wirelessly transmitting and receiving data.

Figure 17:
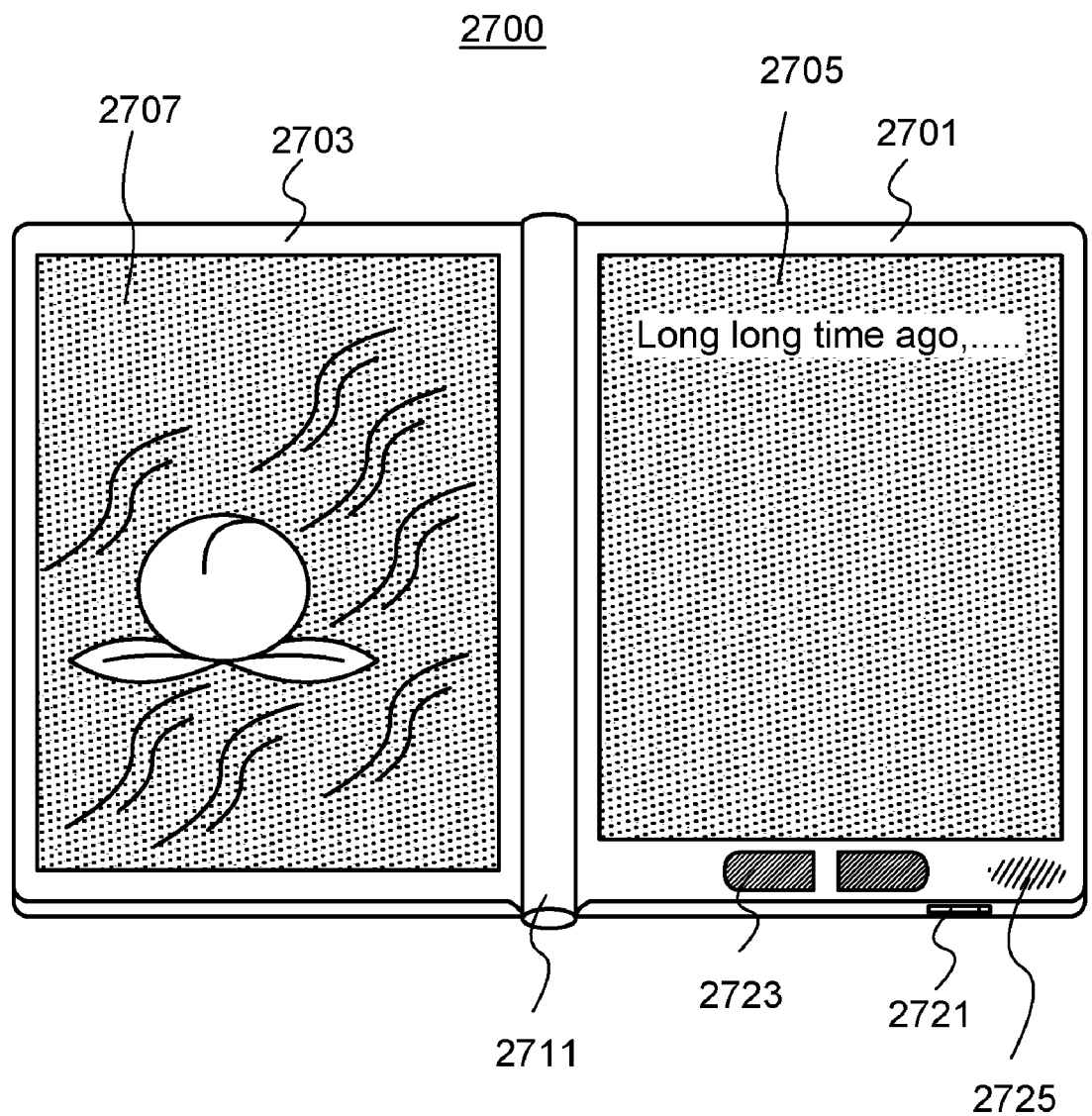
FIG. 17 is an external view illustrating an example of an electronic book reader.

FIG. 17 illustrates an example of an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 17) and graphics can be displayed on a display portion on the left side (the display portion 2707 in FIG. 17).

FIG. 17 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to an AC adapter and various cables such as a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Note that this embodiment can be implemented in combination with any of the other embodiments or example as appropriate.

Embodiment 10

A semiconductor device can be applied to a variety of electronic appliances (including amusement machines). Examples of electronic appliances include television sets (also referred to as televisions or television receivers), monitor of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 18A:
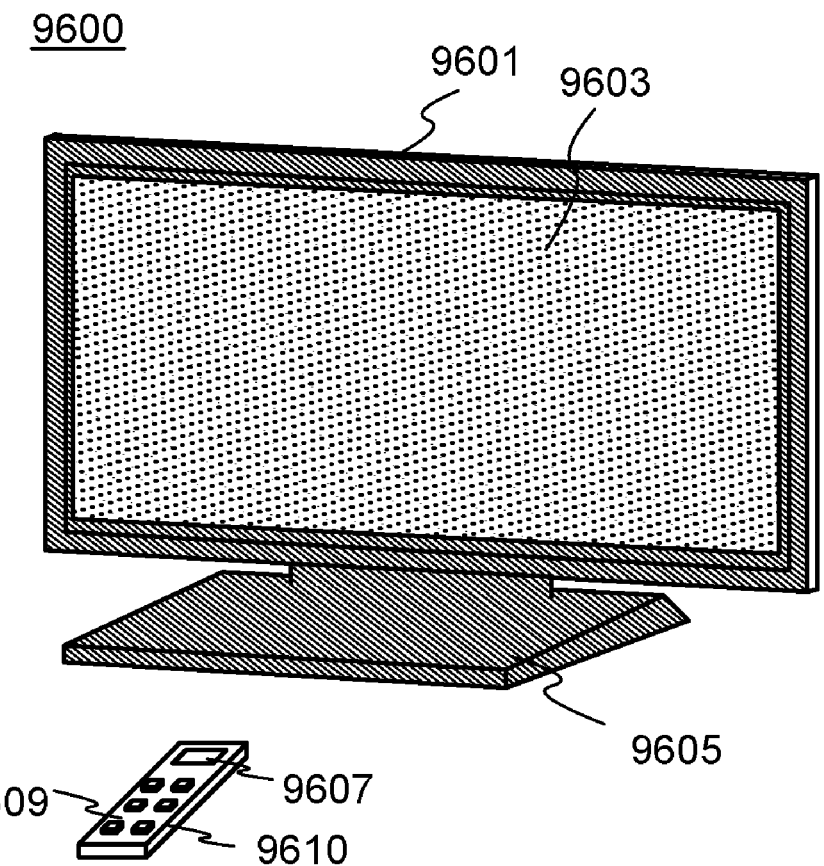
FIG. 18A is an external view of an example of a television device and FIG. 18B is an external view of an example of a digital photo frame.

FIG. 18A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 18B:
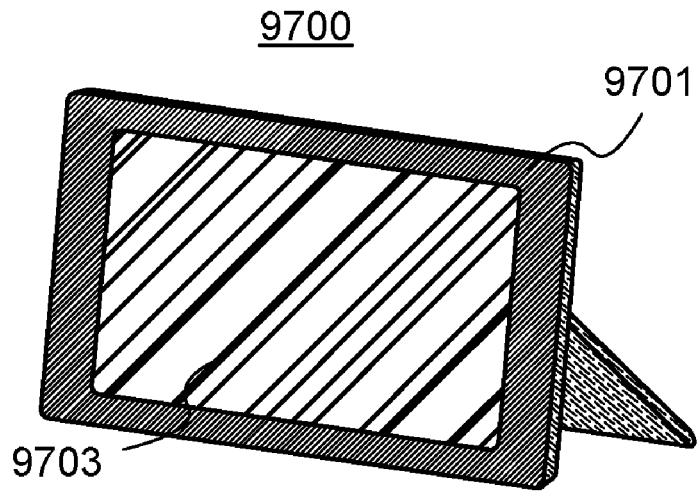

FIG. 18B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. In this case, through wireless communication, desired image data can be downloaded to be displayed.

Figure 19A:
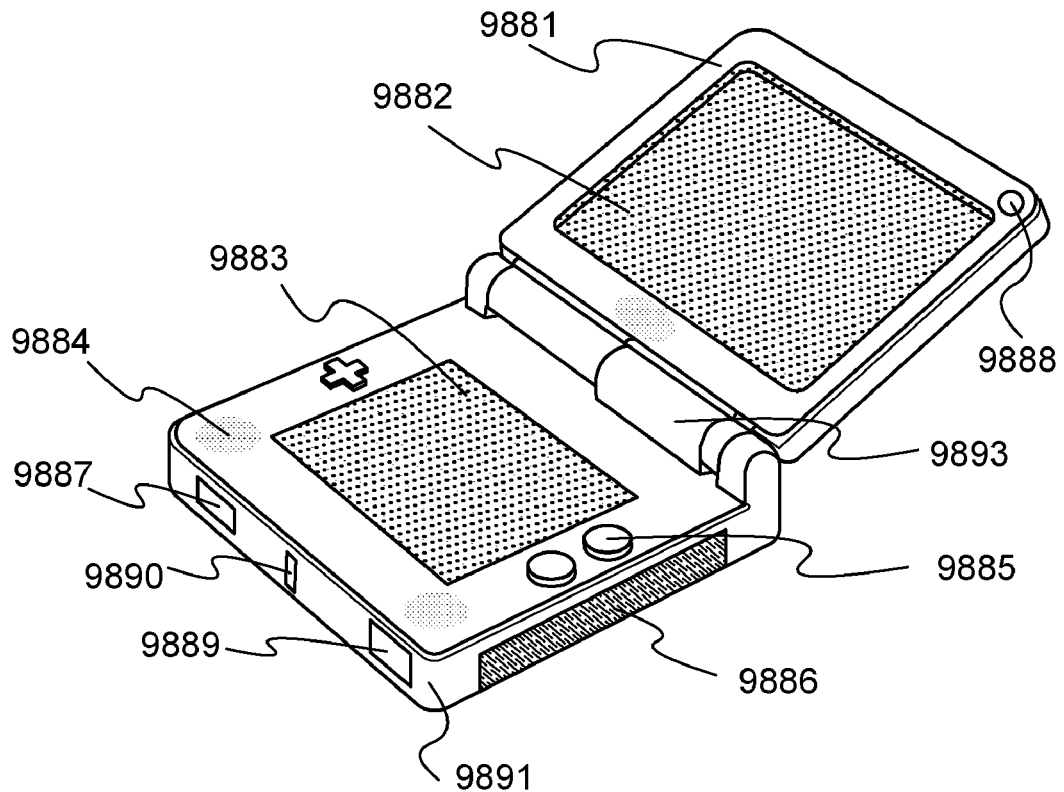
FIGS. 19A and 19B are external views illustrating examples of an amusement machine.

FIG. 19A illustrates a portable amusement machine including two housings: a housing 9881 and a housing 9891. The housings 9881 and 9891 are connected to each other with a connection portion 9893 so as to be opened and closed. A display portion 9882 and a display portion 9883 are incorporated in the housing 9881 and the housing 9891, respectively. In addition, the portable amusement machine illustrated in FIG. 19A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. Note that the structure of the portable amusement machine is not limited to the above and other structures provided with at least a semiconductor device of an embodiment of the present invention may be employed. The portable amusement machine illustrated in FIG. 19A has a function of reading a program or data stored in a recording medium to display it on the display portion, and a function of sharing information with another portable amusement machine by wireless communication. The portable amusement machine illustrated in FIG. 19A may have various functions without limitation to the above.

Figure 19B:
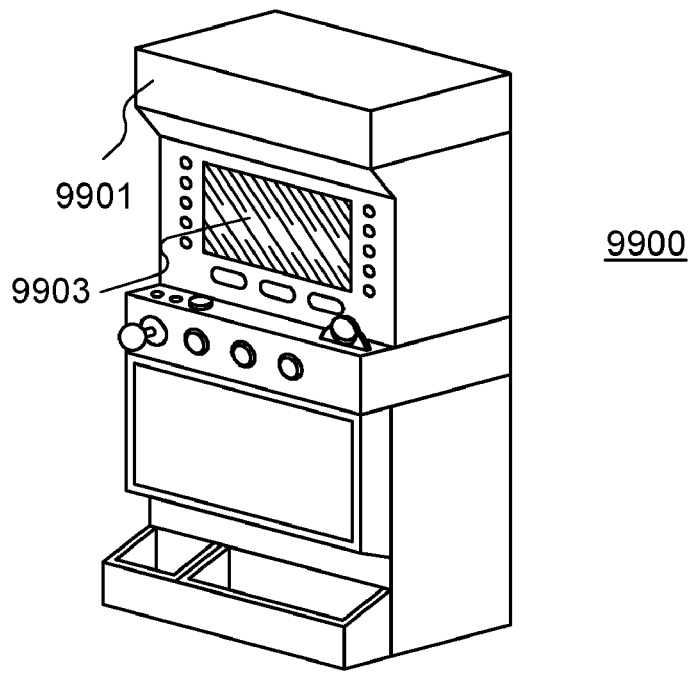

FIG. 19B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. Note that the structure of the slot machine 9900 is not limited to the above and other structures provided with at least a semiconductor device of an embodiment of the present invention may be employed.

Figure 20A:
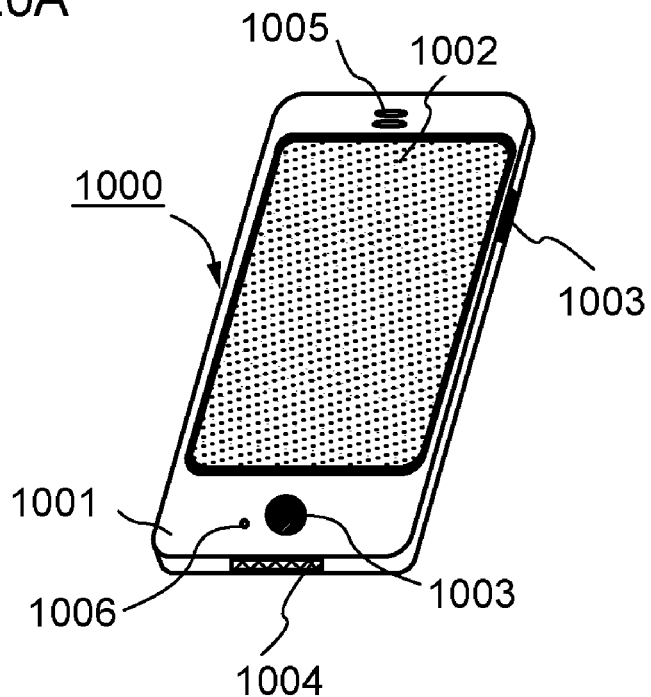
FIGS. 20A and 20B are external views illustrating examples of a cellular phone.

FIG. 20A illustrates an example of a cellular phone 1000. The cellular phone 1000 is provided with a display portion 1002 incorporated in a housing 1001, operation buttons 1003, an external connection port 1004, a speaker 1005, a microphone 1006, and the like.

When the display portion 1002 of the cellular phone 1000 illustrated in FIG. 20A is touched with a finger or the like, data can be input into the cellular phone 1000. Furthermore, making calls, composing mails, or the like can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the cellular phone 1000, display on the screen of the display portion 1002 can be automatically switched by determining the direction of the cellular phone 1000 (whether the cellular phone 1000 is placed horizontally or vertically for a landscape mode or a portrait mode).

The screen mode is switched by touching the display portion 1002, operating the operation buttons 1003 of the housing 1001, or the like. Alternatively, the screen mode can be switched depending on the kind of images displayed on the display portion 1002. For example, when a signal of an image displayed on the display portion is of moving image data, the screen mode is switched to the display mode. When the signal is of text data, the screen mode is switched to the input mode.

Furthermore, in the input mode, when input by touching the display portion 1002 is not performed for a certain period while a signal is detected by the optical sensor in the display portion 1002, the screen mode may be controlled so as to be switched from the input mode to the display mode.

The display portion 1002 can function as an image sensor. For example, an image of a palm print, a fingerprint, or the like is taken by touching the display portion 1002 with the palm or the finger, whereby personal authentication can be performed. Furthermore, by providing a backlight or a sensing light source emitting a near-infrared light for the display portion, an image of a finger vein, a palm vein, or the like can also be taken.

Figure 20B:
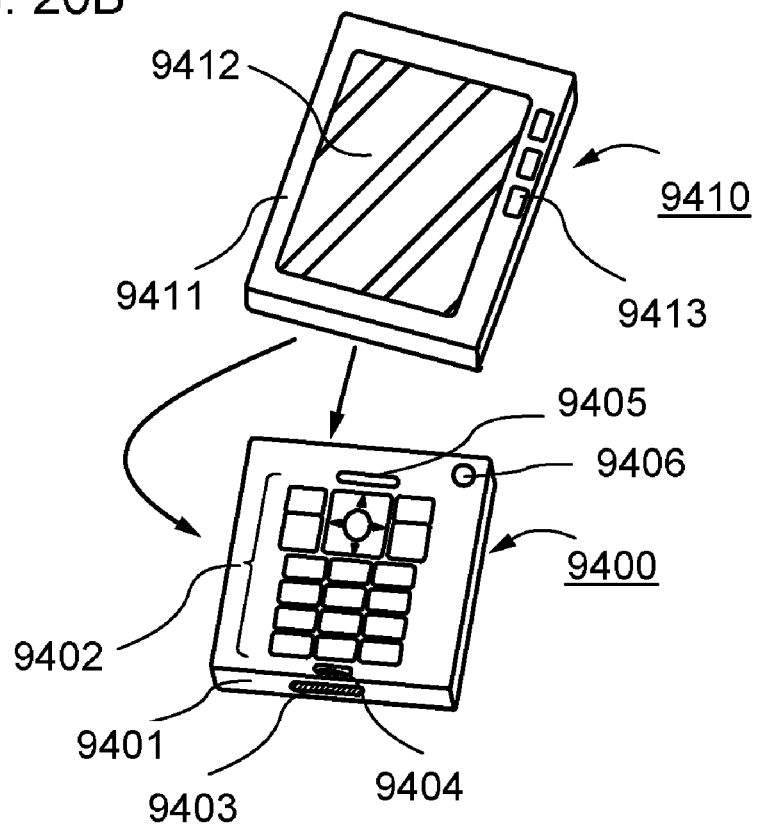

FIG. 20B illustrates another example of a cellular phone. The cellular phone in FIG. 20B has a display device 9410 and a communication device 9400. The display device 9410 includes a housing 9411, a display portion 9412, and operation buttons 9413. The communication device 9400 includes operation buttons 9402, an external input terminal 9403, a microphone 9404, a speaker 9405, and a light-emitting portion 9406 that emits light when a phone call is received. The display device 9410 can be detached from or attached to the communication device 9400 which has a phone function by moving in two directions represented by the allows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that this embodiment can be implemented in combination with any of the other embodiments or example as appropriate.

Embodiment 11

In this embodiment, an example, which is different from the above embodiments, of a method for manufacturing a semiconductor device is described with reference to drawings. Note that many parts of a step of manufacturing a semiconductor device in this embodiment are the same as those in the other embodiments. Therefore, hereinafter, description for the same parts as those of the above embodiments is omitted and different parts from the above embodiments are described in detail.

Figure 21A:
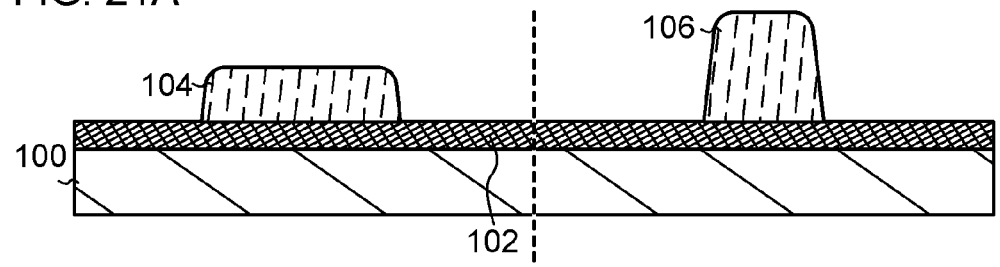
FIGS. 21A to 21D are cross-sectional views illustrating a method for manufacturing a semiconductor device of Embodiment 11.

First, the conductive layer 102 is formed over the substrate 100 and the resist masks 104 and 106 are selectively formed over the conductive layer 102 (see FIG. 21A). The step is similar to the step in Embodiment 1.

Figure 21B:
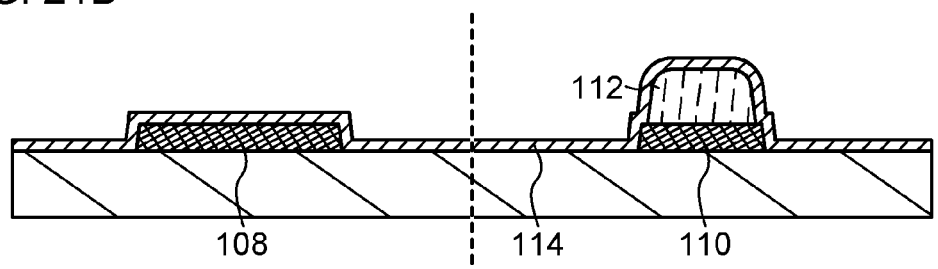

Next, after the conductive layer 102 is etched using the above resist masks 104 and 106 to form the gate electrode 108 and the first wiring 110, the resist masks 104 and 106 are made to recede to form the resist mask 112 over the first wiring 110, and the gate insulating layer 114 is formed so as to cover the resist mask 112, the gate electrode 108, and the first wiring 110 which are formed (see FIG. 21B). The step is also similar to the step in Embodiment 1; therefore, the detail is omitted.

Figure 21C:
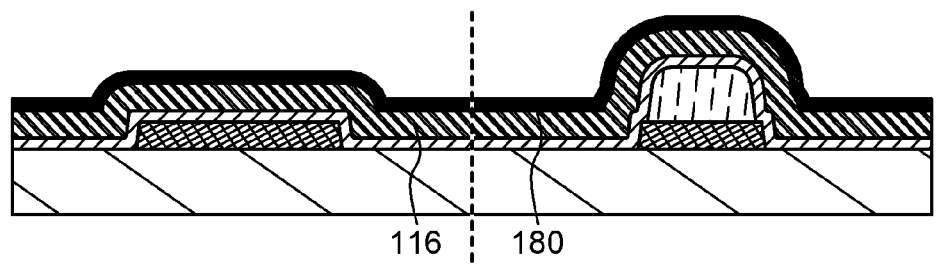

Next, the conductive layer 116 and the semiconductor layer 180 with high conductivity are stacked in this order over the gate insulating layer 114 (see FIG. 21C). The conductive layer 116 can be formed to have a single-layer structure of a molybdenum film or a titanium film. Alternatively, the conductive layer 116 may be formed to have a stacked-layer structure and can have a stacked-layer structure of an aluminum film and a titanium film, for example. A three-layer structure in which a titanium film, an aluminum film, and a titanium film are stacked in this order may be employed. A three-layer structure in which a molybdenum film, an aluminum film, and a molybdenum film are stacked in this order may be employed. Further, an aluminum film containing neodymium (an Al—Nd film) may be used as the aluminum film used for these stacked-layer structures. Further alternatively, the conductive layer 116 may have a single-layer structure of an aluminum film containing silicon. The detail of the conductive layer 102 or the like in Embodiment 1 can be referred to for the detail of the conductive layer 116.

There is no particular limitation on the semiconductor layer 180 with high conductivity as long as the semiconductor layer 180 with high conductivity has higher conductivity than an island-shape semiconductor layer which is formed later. For example, in the case where the island-shape semiconductor layer which is formed later is formed using an oxide semiconductor material, a film formed of an oxide semiconductor material similar to that of the semiconductor layer with high conductivity can be formed under a different formation condition. Needless to say, the semiconductor layer 180 with high conductivity may be formed using a different material from the island-shape semiconductor layer which is formed later. In this embodiment, the case where the semiconductor layer 180 with high conductivity and the island-shape semiconductor layer which is formed later are formed using the same material is described.

In this embodiment, the semiconductor layer 180 with high conductivity is formed by a sputtering method using an oxide semiconductor target containing In, Ga, and Zn ($In_2O_3$:$Ga_2O_3$:ZnO=1:1:1). The sputtering can be performed under the following conditions, for example; the distance between the substrate 100 and the target is 30 mm to 500 mm; the pressure is 0.1 Pa to 2.0 Pa; direct current (DC) power supply is 0.25 kW to 5.0 kW; the temperature is 20° C. to 100° C.; the atmosphere is a rare gas atmosphere such as argon, an oxide atmosphere, or a mixed atmosphere of a rare gas such as argon and oxide.

Figure 21D:
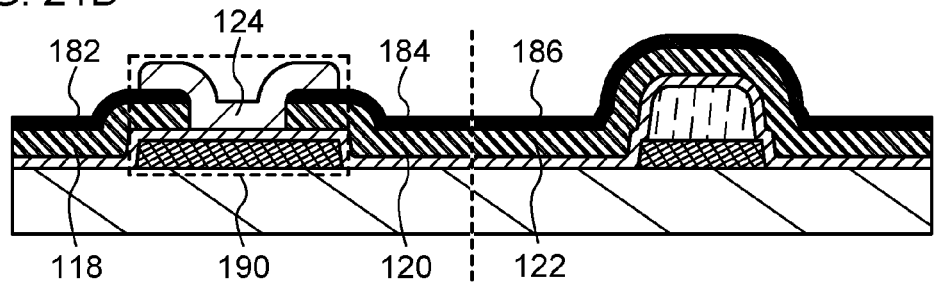

Next, after the conductive layer 116 and the semiconductor layer 180 with high conductivity are selectively etched to form the source electrode 118, the drain electrode 120, the second wiring 122, and the semiconductor layers 182, 184, and 186 with high conductivity, the island-shape semiconductor layer 124 is formed so as to be partly in contact with the source electrode 118, the drain electrode 120, and the semiconductor layers 182 and 184 with high conductivity in a region overlapped with the gate electrode 108 (see FIG. 21D).

The semiconductor layer 186 with high conductivity is provided over the second wiring 122 here; however, the present invention disclosed is not limited thereto. The semiconductor layer with high conductivity may be formed so as to be in contact with at least the source electrode 118, the drain electrode 120, and the island-shape semiconductor layer 124. Further, before the island-shape semiconductor layer 124 is formed, a surface on which the island-shape semiconductor layer 124 is to be formed may be subjected to surface treatment. Embodiment 1 or the like can be referred to for a specific example of surface treatment.

In this embodiment, the island-shape semiconductor layer 124 is formed by a sputtering method using an oxide semiconductor target containing In, Ga, and Zn ($In_2O_3$:$Ga_2O_3$:ZnO=1:1:1). The sputtering can be performed under the following conditions, for example; the distance between the substrate 100 and the target is 30 mm to 500 mm; the pressure is 0.1 Pa to 2.0 Pa; direct current (DC) power supply is 0.25 kW to 5.0 kW; the temperature is 20° C. to 100° C.; the atmosphere is a rare gas atmosphere such as argon, an oxide atmosphere, or a mixed atmosphere of a rare gas such as argon and oxide.

In this embodiment, film formation conditions of the semiconductor layer 180 with high conductivity and the island-shape semiconductor layer 124 are different. For example, a flow rate ratio of an oxygen gas to an argon gas in the film formation conditions of the semiconductor layer 180 with high conductivity is smaller than that in the film formation conditions of the island-shape semiconductor layer 124. More specifically, the semiconductor layer with high conductivity is formed in a rare gas (such as argon or helium) atmosphere or an atmosphere containing an oxygen gas at 10% or less and a rare gas at 90% or more. The semiconductor layer with normal conductivity is formed in an oxygen atmosphere or an atmosphere in which a flow rate of an oxygen gas is 1 time or more that of a rare gas. In such a manner, two kinds of semiconductor layers having different conductivities can be formed.

In this embodiment, the case where the island-shape semiconductor layer 124 is formed using an oxide semiconductor material is described; however, the present invention disclosed is not limited thereto. The island-shape semiconductor layer 124 may be formed using a semiconductor material such as silicon, germanium, silicon germanium, silicon carbide, gallium arsenide, or indium phosphide.

In addition, Embodiment 1 or the like may be referred to for the other details.

Through the above steps, a transistor 190 in which the island-shape semiconductor layer 124 is used as a channel formation region can be formed. Further, in a region where the second wiring 122 is overlapped with the first wiring 110 (a region where the first wiring 110 and the second wiring 122 intersect with each other), a stacked-layer structure of the first wiring 110, the resist mask 112, the gate insulating layer 114, the second wiring 122, and the semiconductor layer 186 with high conductivity can be formed. Thus, the capacitance value of the parasitic capacitance can be reduced while suppressing increase in the number of manufacturing steps.

After that, a variety of electrodes and a wiring are formed, whereby a semiconductor device provided with the transistor 190 is completed.

As described in this embodiment, part of the resist masks formed using a multi-tone mask is provided between the first wiring and the second wiring, whereby the capacitance value of the parasitic capacitance can be reduced while suppressing increase in the number of manufacturing steps.

Moreover, as described in this embodiment, the semiconductor layer with high conductivity is provided so as to be in contact with the source electrode (or the gate electrode) and the island-shape semiconductor layer, whereby electrical characteristics and reliability of a transistor can be improved. Thus, an excellent semiconductor device can be provided.

Note that this embodiment can be implemented in combination with any of the other embodiments or example as appropriate.

Embodiment 12

In this embodiment, an example, which is different from the above embodiments, of a method for manufacturing a semiconductor device is described with reference to drawings. Note that many parts of a step of manufacturing a semiconductor device in this embodiment are the same as those in the other embodiments. Therefore, hereinafter, description for the same parts as those of the above embodiments is omitted and different parts from the above embodiments are described in detail.

Figure 22A:
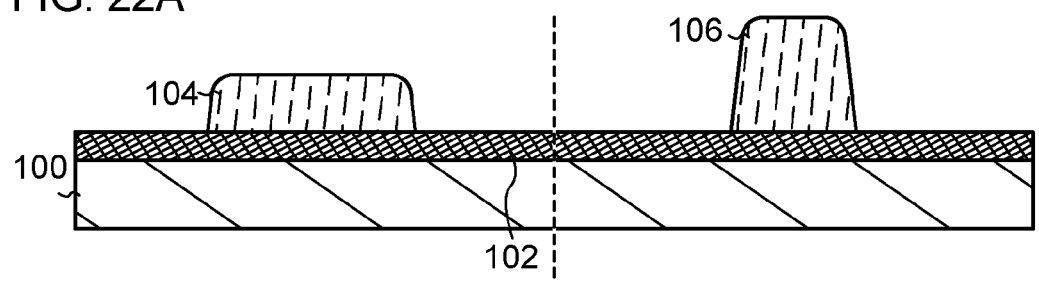
FIGS. 22A to 22D are cross-sectional views illustrating a method for manufacturing a semiconductor device of Embodiment 12.

First, the conductive layer 102 is formed over the substrate 100 and the resist masks 104 and 106 are selectively formed over the conductive layer 102 (see FIG. 22A). The step is similar to the step in Embodiment 1.

Figure 22B:
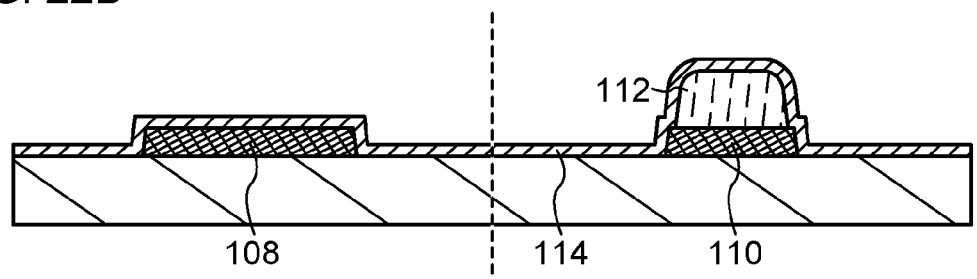

Next, after the conductive layer 102 is etched using the above resist masks 104 and 106 to form the gate electrode 108 and the first wiring 110, the resist masks 104 and 106 are made to recede to form the resist mask 112 over the first wiring 110, and the gate insulating layer 114 is formed so as to cover the resist mask 112, the gate electrode 108, and the first wiring 110 which are formed (see FIG. 22B). The step is also similar to the step in Embodiment 1; therefore, the detail is omitted.

Figure 22C:
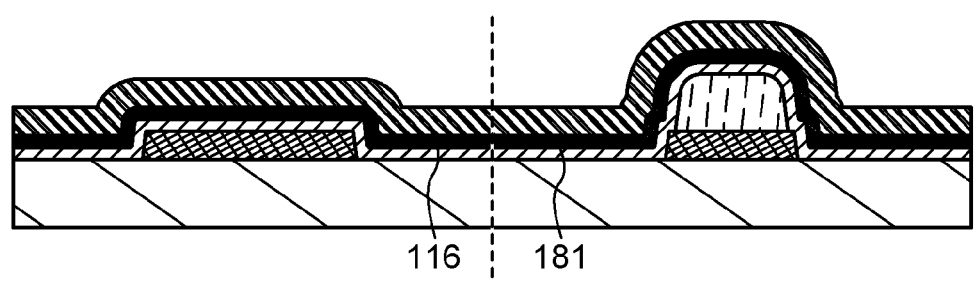

Next, a semiconductor layer 181 with high conductivity and the conductive layer 116 are stacked in this order over the gate insulating layer 114 (see FIG. 22C).

There is no particular limitation on the semiconductor layer 181 with high conductivity as long as the semiconductor layer 181 with high conductivity has higher conductivity than an island-shape semiconductor layer which is formed later. For example, in the case where the island-shape semiconductor layer which is formed later is formed using an oxide semiconductor material, a film formed of an oxide semiconductor material similar to that of the semiconductor layer with high conductivity can be formed under a different formation condition. Needless to say, the semiconductor layer 181 with high conductivity may be formed using a different material from the island-shape semiconductor layer which is formed later. In this embodiment, the case where the semiconductor layer 181 with high conductivity and the island-shape semiconductor layer which is formed later are formed using the same material is described.

In this embodiment, the semiconductor layer 181 with high conductivity is formed by a sputtering method using an oxide semiconductor target containing In, Ga, and Zn ($In_2O_3$:$Ga_2O_3$:$ZnO$=1:1:1). The sputtering can be performed under the following conditions, for example; the distance between the substrate 100 and the target is 30 mm to 500 mm; the pressure is 0.1 Pa to 2.0 Pa; direct current (DC) power supply is 0.25 kW to 5.0 kW; the temperature is 20° C. to 100° C.; the atmosphere is a rare gas atmosphere such as argon, an oxide atmosphere, or a mixed atmosphere of a rare gas such as argon and oxide.

The conductive layer 116 can be formed to have a single-layer structure of a molybdenum film or a titanium film. Alternatively, the conductive layer 116 may be formed to have a stacked-layer structure and can have a stacked-layer structure of an aluminum film and a titanium film, for example. A three-layer structure in which a titanium film, an aluminum film, and a titanium film are stacked in this order may be employed. A three-layer structure in which a molybdenum film, an aluminum film, and a molybdenum film are stacked in this order may be employed. Further, an aluminum film containing neodymium (an Al—Nd film) may be used as the aluminum film used for these stacked-layer structures. Further alternatively, the conductive layer 116 may have a single-layer structure of an aluminum film containing silicon. The detail of the conductive layer 102 or the like in Embodiment 1 can be referred to for the detail of the conductive layer 116.

Figure 22D:
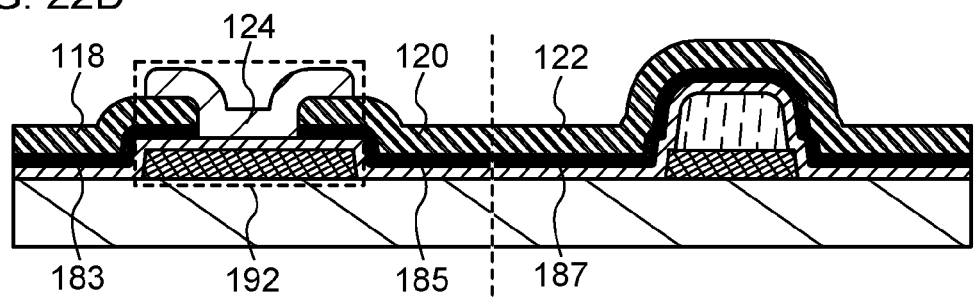

Next, after the conductive layer 116 and the semiconductor layer 181 with high conductivity are selectively etched to form the source electrode 118, the drain electrode 120, the second wiring 122, and semiconductor layers 183, 185, and 187 with high conductivity, the island-shape semiconductor layer 124 is formed so as to be partly in contact with the source electrode 118, the drain electrode 120, and the semiconductor layers 183 and 185 with high conductivity in the region overlapped with the gate electrode 108 (see FIG. 22D).

Note that the semiconductor layer with high conductivity may be formed so as to be in contact with at least the source electrode 118, the drain electrode 120, and the island-shape semiconductor layer 124. Further, before the island-shape semiconductor layer 124 is formed, a surface on which the island-shape semiconductor layer 124 is to be formed may be subjected to surface treatment. Embodiment 1 or the like can be referred to for a specific example of surface treatment.

In this embodiment, the island-shape semiconductor layer 124 is formed, for example, by a sputtering method using an oxide semiconductor target containing In, Ga, and Zn ($In_2O_3$:$Ga_2O_3$:$ZnO$=1:1:1). The sputtering can be performed under the following conditions, for example; the distance between the substrate 100 and the target is 30 mm to 500 mm; the pressure is 0.1 Pa to 2.0 Pa; direct current (DC) power supply is 0.25 kW to 5.0 kW; the temperature is 20° C. to 100° C.; the atmosphere is a rare gas atmosphere such as argon, an oxide atmosphere, or a mixed atmosphere of a rare gas such as argon and oxide.

In this embodiment, film formation conditions of the semiconductor layer 181 with high conductivity and the island-shape semiconductor layer 124 are different. For example, a flow rate ratio of an oxygen gas to an argon gas in the film formation conditions of the semiconductor layer 181 with high conductivity is smaller than that in the film formation conditions of the island-shape semiconductor layer 124. More specifically, the semiconductor layer with high conductivity is formed in a rare gas (such as argon or helium) atmosphere or an atmosphere containing an oxygen gas at 10% or less and a rare gas at 90% or more. The semiconductor layer with normal conductivity is formed in an oxygen atmosphere or an atmosphere in which a flow rate of an oxygen gas is 1 time or more that of a rare gas. In such a manner, two kinds of semiconductor layers having different conductivities can be formed.

In this embodiment, the case where the island-shape semiconductor layer 124 is formed using an oxide semiconductor material is described; however, the present invention disclosed is not limited thereto. The island-shape semiconductor layer 124 may be formed using a semiconductor material such as silicon, germanium, silicon germanium, silicon carbide, gallium arsenide, or indium phosphide.

In addition, Embodiment 1 or the like may be referred to for the other details.

Through the above steps, a transistor 192 in which the island-shape semiconductor layer 124 is used as a channel formation region can be formed. Further, in a region where the second wiring 122 is overlapped with the first wiring 110 (a region where the first wiring 110 and the second wiring 122 intersect with each other), a stacked-layer structure of the first wiring 110, the resist mask 112, the gate insulating layer 114, the semiconductor layer 187 with high conductivity, and the second wiring 122 can be formed. Thus, the capacitance value of the parasitic capacitance can be reduced while suppressing increase in the number of manufacturing steps.

After that, a variety of electrodes and a wiring are formed, whereby a semiconductor device provided with the transistor 192 is completed.

As described in this embodiment, part of the resist masks formed using a multi-tone mask is provided between the first wiring and the second wiring, whereby the capacitance value of the parasitic capacitance can be reduced while suppressing increase in the number of manufacturing steps.

Moreover, as described in this embodiment, the semiconductor layer with high conductivity is provided so as to be in contact with the source electrode (or the gate electrode) and the island-shape semiconductor layer, whereby electrical characteristics and reliability of a transistor can be improved. Thus, an excellent semiconductor device can be provided.

Note that this embodiment can be implemented in combination with any of the other embodiments or example as appropriate.

Embodiment 13

In this embodiment, an example, which is different from the above embodiments, of a method for manufacturing a semiconductor device is described with reference to drawings. Note that many parts of a step of manufacturing a semiconductor device in this embodiment are the same as those in the other embodiments. Therefore, hereinafter, description for the same parts as those of the above embodiments is omitted and different parts from the above embodiments are described in detail.

Figure 23A:
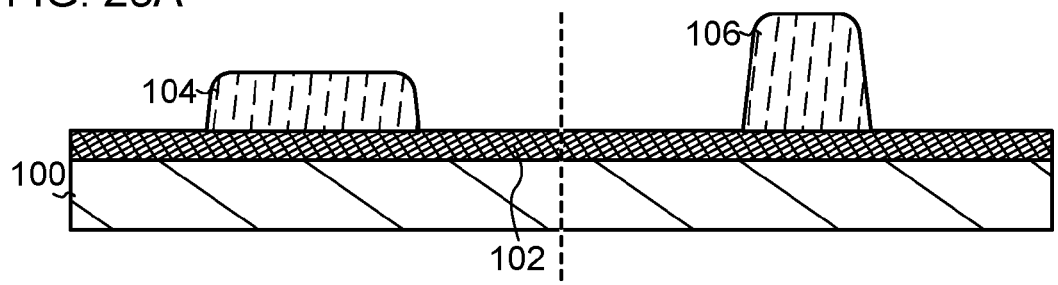
FIGS. 23A to 23D are cross-sectional views illustrating a method for manufacturing a semiconductor device of Embodiment 13.

First, the conductive layer 102 is formed over the substrate 100 and the resist masks 104 and 106 are selectively formed over the conductive layer 102 (see FIG. 23A). The step is similar to the step in Embodiment 1.

Figure 23B:
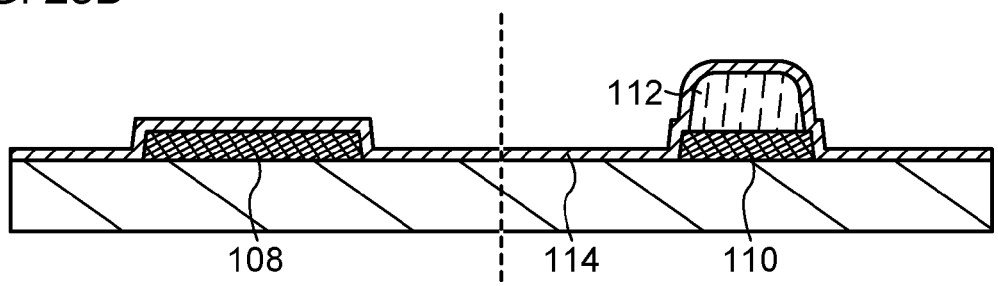

Next, after the conductive layer 102 is etched using the above resist masks 104 and 106 to form the gate electrode 108 and the first wiring 110, the resist masks 104 and 106 are made to recede to form the resist mask 112 over the first wiring 110, and the gate insulating layer 114 is formed so as to cover the resist mask 112, the gate electrode 108, and the first wiring 110 which are formed (see FIG. 23B). The step is also similar to the step in Embodiment 1; therefore, the detail is omitted.

Figure 23C:
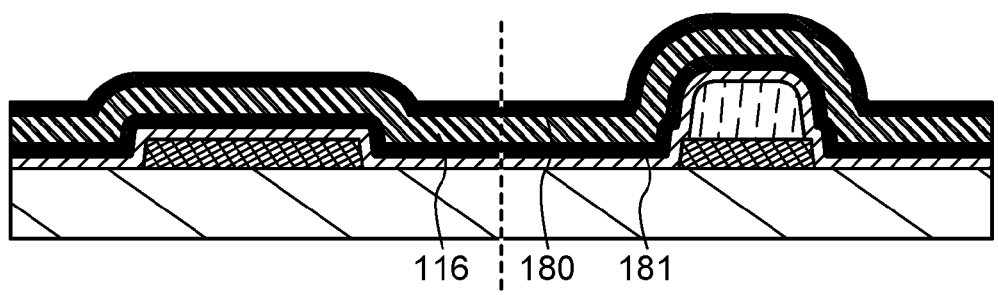

Next, the semiconductor layer 181 with high conductivity, the conductive layer 116, and the semiconductor layer with high conductivity 180 are stacked in this order over the gate insulating layer 114 (see FIG. 23C).

There is no particular limitation on the semiconductor layers 180 and 181 with high conductivity as long as the semiconductor layers 180 and 181 with high conductivity have higher conductivity than an island-shape semiconductor layer which is formed later. For example, in the case where the island-shape semiconductor layer which is formed later is formed using an oxide semiconductor material, a film formed of an oxide semiconductor material similar to that of the semiconductor layer with high conductivity can be formed under a different formation condition. Needless to say, the semiconductor layers 180 and 181 with high conductivity may be formed using a different material from the island-shape semiconductor layer which is formed later. Further, the semiconductor layers 180 and 181 with high conductivity may be formed using different materials from each other. In this embodiment, the case where the semiconductor layers 180 and 181 with high conductivity and the island-shape semiconductor layer which is formed later are formed using the same material is described.

In this embodiment, the semiconductor layers 180 and 181 with high conductivity are formed by a sputtering method using an oxide semiconductor target containing In, Ga, and Zn ($In_2O_3:Ga_2O_3:ZnO=1:1:1$). The sputtering can be performed under the following conditions, for example; the distance between the substrate 100 and the target is 30 mm to 500 mm; the pressure is 0.1 Pa to 2.0 Pa; direct current (DC) power supply is 0.25 kW to 5.0 kW; the temperature is 20° C. to 100° C.; the atmosphere is a rare gas atmosphere such as argon, an oxide atmosphere, or a mixed atmosphere of a rare gas such as argon and oxide.

The conductive layer 116 can be formed to have a single-layer structure of a molybdenum film or a titanium film. Alternatively, the conductive layer 116 may be formed to have a stacked-layer structure and can have a stacked-layer structure of an aluminum film and a titanium film, for example. A three-layer structure in which a titanium film, an aluminum film, and a titanium film are stacked in this order may be employed. A three-layer structure in which a molybdenum film, an aluminum film, and a molybdenum film are stacked in this order may be employed. Further, an aluminum film containing neodymium (an Al—Nd film) may be used as the aluminum film used for these stacked-layer structures. Further alternatively, the conductive layer 116 may have a single-layer structure of an aluminum film containing silicon. The detail of the conductive layer 102 or the like in Embodiment 1 can be referred to for the detail of the conductive layer 116.

Figure 23D:
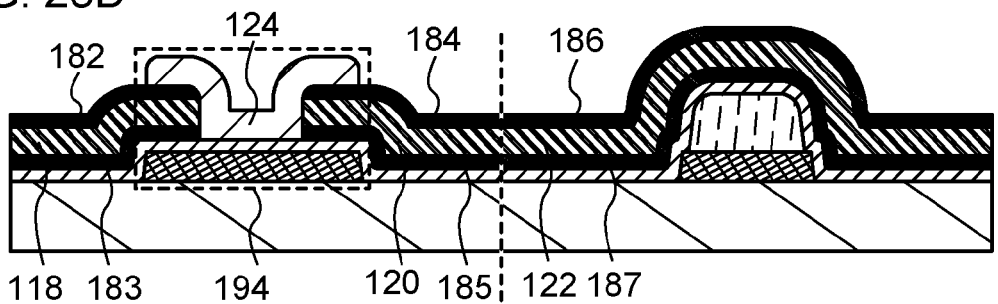

Next, after the conductive layer 116 and the semiconductor layers 180 and 181 with high conductivity are selectively etched to form the source electrode 118, the drain electrode 120, the second wiring 122, and the semiconductor layers 182, 183, 184, 185, 186, and 187 with high conductivity, the island-shape semiconductor layer 124 is formed so as to be partly in contact with the source electrode 118, the drain electrode 120, and the semiconductor layers 182, 183, 184, and 185 with high conductivity in the region overlapped with the gate electrode 108 (see FIG. 23D).

The semiconductor layer with high conductivity may be formed so as to be in contact with at least the source electrode 118, the drain electrode 120, and the island-shape semiconductor layer 124. Further, before the island-shape semiconductor layer 124 is formed, a surface on which the island-shape semiconductor layer 124 is to be formed may be subjected to surface treatment. Embodiment 1 or the like can be referred to for a specific example of surface treatment.

In this embodiment, the island-shape semiconductor layer 124 is formed by a sputtering method using an oxide semiconductor target containing In, Ga, and Zn ($In_2O_3:Ga_2O_3:ZnO=1:1:1$). The sputtering can be performed under the following conditions, for example; the distance between the substrate 100 and the target is 30 mm to 500 mm; the pressure is 0.1 Pa to 2.0 Pa; direct current (DC) power supply is 0.25 kW to 5.0 kW; the temperature is 20° C. to 100° C.; the atmosphere is a rare gas atmosphere such as argon, an oxide atmosphere, or a mixed atmosphere of a rare gas such as argon and oxide.

In this embodiment, film formation conditions of the semiconductor layers 180 and 181 with high conductivity and the island-shape semiconductor layer 124 are different. For example, a flow rate ratio of an oxygen gas to an argon gas in the film formation conditions of the semiconductor layers 180 and 181 with high conductivity is smaller than that in the film formation conditions of the island-shape semiconductor layer 124. More specifically, the semiconductor layer with high conductivity is formed in a rare gas (such as argon or helium) atmosphere or an atmosphere containing an oxygen gas at 10% or less and a rare gas at 90% or more. The semiconductor layer with normal conductivity is formed in an oxygen atmosphere or an atmosphere in which a flow rate of an oxygen gas is 1 time or more that of a rare gas. In such a manner, two kinds of semiconductor layers having different conductivities can be formed.

In this embodiment, the case where the island-shape semiconductor layer 124 is formed using an oxide semiconductor material is described; however, the present invention disclosed is not limited thereto. The island-shape semiconductor layer 124 may be formed using a semiconductor material such as silicon, germanium, silicon germanium, silicon carbide, gallium arsenide, or indium phosphide.

In addition, Embodiment 1 or the like may be referred to for the other details.

Through the above steps, a transistor 194 in which the island-shape semiconductor layer 124 is used as a channel formation region can be formed. Further, in a region where the second wiring 122 is overlapped with the first wiring 110 (a region where the first wiring 110 and the second wiring 122 intersect with each other), a stacked-layer structure of the first wiring 110, the resist mask 112, the gate insulating layer 114, the semiconductor layer 187 with high conductivity, the second wiring 122, and the semiconductor layer 186 with high conductivity can be formed. Thus, the capacitance value of the parasitic capacitance can be reduced while suppressing increase in the number of manufacturing steps.

After that, a variety of electrodes and a wiring are formed, whereby a semiconductor device provided with the transistor 194 is completed.

As described in this embodiment, part of the resist masks formed using a multi-tone mask is provided between the first wiring and the second wiring, whereby the capacitance value of the parasitic capacitance can be reduced while suppressing increase in the number of manufacturing steps.

Moreover, as described in this embodiment, the semiconductor layer with high conductivity is provided so as to be in contact with the source electrode (or the gate electrode) and the island-shape semiconductor layer, whereby electrical characteristics and reliability of a transistor can be improved. Thus, an excellent semiconductor device can be provided.

Note that this embodiment can be implemented in combination with any of the other embodiments or example as appropriate.

Example 1

In this example, in order to confirm an effect of the present invention disclosed, current-voltage characteristics and mobility characteristics of a transistor were examined. Description is hereinafter made with reference to drawings.

Figure 24A:
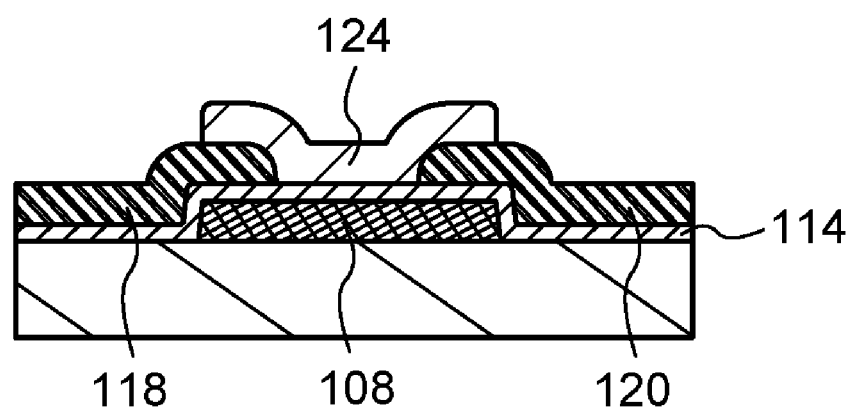
FIGS. 24A and 24B are cross-sectional views showing structures of transistors of Example 1.
Figure 24B:
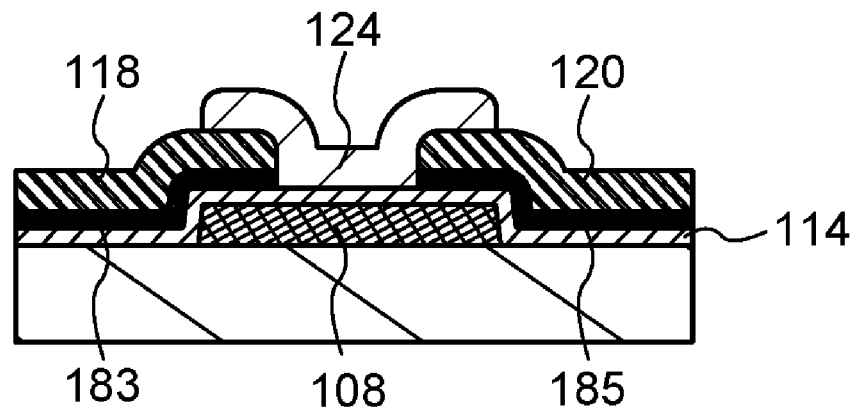

Examination of this example was performed using a transistor (hereinafter, a transistor B) according to Embodiment 12 (see FIG. 24B). For comparison, a similar examination was performed on a transistor (hereinafter, a transistor A) in which a semiconductor layer with high conductivity which is under a source electrode (or a drain electrode) is not provided (see FIG. 24A).

A method for manufacturing transistors followed those of Embodiment 12. Here, the only difference in a manufacturing step between the transistors A and B is whether there is a step of forming the semiconductor layer with high conductivity which is under the source electrode (or the drain electrode) or not. Note that titanium was used for the source electrode (or the drain electrode) and an oxide semiconductor material containing indium, gallium, and zinc was used for the semiconductor layer with high conductivity and an island-shape semiconductor layer. In addition, before the island-shape semiconductor layer is formed, reverse sputtering is performed as surface treatment. The channel length of the transistors was 20 μm and the channel width thereof was 20 nm. The thickness of the semiconductor layers with high conductivity was 5 nm.

Figure 25A:
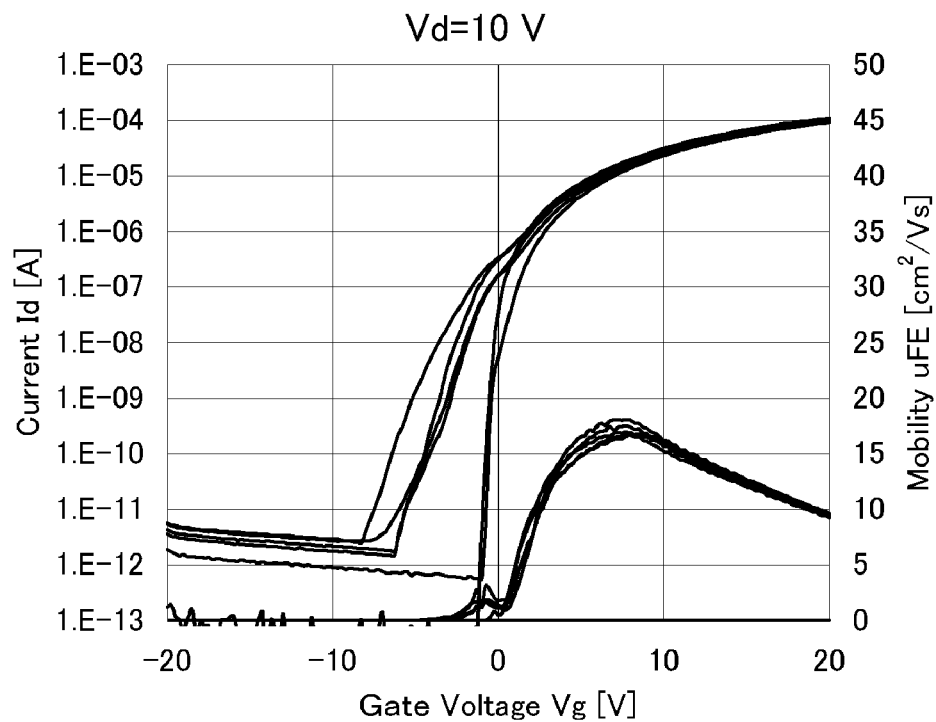
FIGS. 25A and 25B are graphs showing electric characteristics of transistors of Example 1.
Figure 25B:
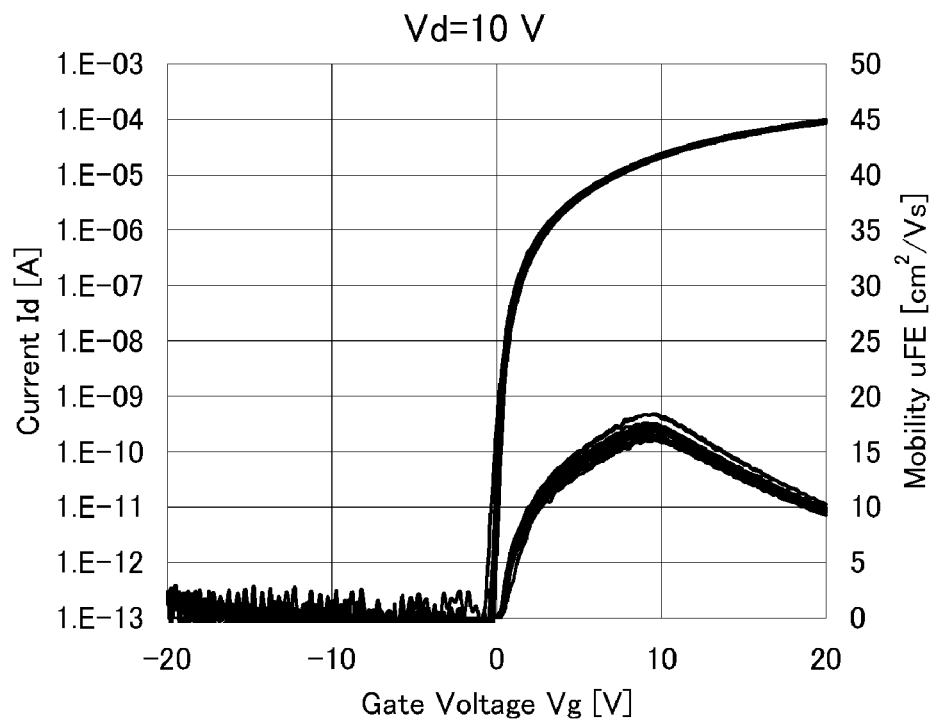

FIG. 25A shows current-voltage characteristics and mobility characteristics of the transistor A and FIG. 25B shows current-voltage characteristics and mobility characteristics of the transistor B. The horizontal axis indicates gate voltage (Vg) and the vertical axis indicates a current value (Id) or field effect mobility (μFE). Here, source-drain voltage was 10 V. In FIG. 25A, there were large variations in current-voltage characteristics. On the other hand, in FIG. 25B, there were extremely small variations in current-voltage characteristics.

The details of the above phenomenon are unclear; however, improvement of electrical connection between the island-shape semiconductor layer and the source electrode (or the drain electrode) due to the semiconductor layer with high conductivity, or the like is considered as a cause of that.

In such a manner, the semiconductor layer with high conductivity is provided between the source electrode (or the drain electrode) and the island-shape semiconductor layer, whereby a semiconductor device with excellent electrical characteristics can be provided. This example can be implemented in combination with any of the other embodiments as appropriate.

This application is based on Japanese Patent Application serial No. 2008-330258 filed with Japan Patent Office on Dec. 25, 2008, the entire contents of which are hereby incorporated by reference.

What is claimed is:

1. A display device comprising:
   a first wiring including a gate electrode;
   a resist mask over a portion of the first wiring;
   a semiconductor layer over the gate electrode;
   a second wiring including a source electrode; and
   a pixel electrode,
   wherein the source electrode is electrically connected to the semiconductor layer,
   wherein the pixel electrode is electrically connected to the semiconductor layer, and
   wherein the second wiring crosses over the first wiring with the resist mask interposed therebetween.

2. The display device according to claim 1, wherein the semiconductor layer includes an oxide semiconductor material.

3. The display device according to claim 1, wherein the first wiring is wider than the second wiring.

4. The display device according to claim 1, wherein the display device is incorporated in one selected from the group consisting of an e-book reader, a television set, a digital photo frame, an amusement machine, and a cellular phone.

5. A display device comprising:
   a first wiring including a gate electrode;
   a resist mask over a portion of the first wiring;
   a gate insulating layer over the first wiring and the resist mask;
   a semiconductor layer over the gate insulating layer;
   a second wiring including a source electrode; and
   a pixel electrode,
   wherein the source electrode is electrically connected to the semiconductor layer,
   wherein the pixel electrode is electrically connected to the semiconductor layer, and
   wherein the second wiring crosses over the first wiring with the resist mask and the gate insulating layer interposed therebetween.

6. The display device according to claim 5, wherein the semiconductor layer includes an oxide semiconductor material.

7. The display device according to claim 5, wherein the first wiring is wider than the second wiring.

8. The display device according to claim 5, wherein the display device is incorporated in one selected from the group consisting of an e-book reader, a television set, a digital photo frame, an amusement machine, and a cellular phone.

9. A display device comprising:
   a first wiring including a gate electrode;
   a resist mask over a portion of the first wiring;
   a gate insulating layer over the first wiring and the resist mask;
   a semiconductor layer over the gate insulating layer;
   a second wiring including a source electrode;
   a transparent conductive layer over a portion of the second wiring; and
   a pixel electrode, wherein the source electrode is electrically connected to the semiconductor layer, wherein the pixel electrode is electrically connected to the semiconductor layer, and wherein the second wiring and the transparent conductive layer cross over the first wiring with the resist mask and the gate insulating layer interposed therebetween.

10. The display device according to claim 9, wherein the pixel electrode is made of a same material as the transparent conductive layer.

11. The display device according to claim 9, wherein the semiconductor layer includes an oxide semiconductor material.

12. The display device according to claim 9, wherein the first wiring is wider than the second wiring.

13. The display device according to claim 9, wherein the display device is incorporated in one selected from the group consisting of an e-book reader, a television set, a digital photo frame, an amusement machine, and a cellular phone.

* * * * *